United States Patent
Ikeda et al.

(10) Patent No.: US 6,292,426 B1
(45) Date of Patent: Sep. 18, 2001

(54) SEMICONDUCTOR MEMORY DEVICE HAVING AN SRAM AND A DRAM ON A SINGLE CHIP

(75) Inventors: Hitoshi Ikeda; Akihiro Funyu; Shinya Fujioka; Takaaki Suzuki; Masao Taguchi; Kimiaki Satoh; Kotoku Sato, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/531,498

(22) Filed: Mar. 21, 2000

(30) Foreign Application Priority Data

May 31, 1999 (JP) .................................................. 11-150792

(51) Int. Cl.[7] ...................................................... G11C 8/00
(52) U.S. Cl. ............................... 365/230.03; 365/230.04; 365/230.06; 365/154; 365/149
(58) Field of Search ...................... 365/230.03, 230.04, 365/230.06, 154, 149

(56) References Cited

U.S. PATENT DOCUMENTS

| | | | |
|---|---|---|---|
| 5,890,195 | * 3/1999 | Rao | 711/105 |
| 5,991,851 | * 11/1999 | Alwais et al. | 711/106 |
| 6,151,256 | * 11/2000 | Maesako et al. | 365/189.01 |
| 6,151,268 | * 11/2000 | Yoshikawa | 365/230.09 |

* cited by examiner

Primary Examiner—David Nelms
Assistant Examiner—Connie C. Yoha
(74) Attorney, Agent, or Firm—Arent Fox Kintner Plotkin & Kahn, PLLC

(57) ABSTRACT

A semiconductor memory device includes an SRAM provided on a chip, the SRAM including an SRAM cell array. A DRAM is provided on the chip, the DRAM including a DRAM cell array. An address input circuit receives an address signal, the address signal having a first portion and a second portion, the first portion carrying a unique value of row-column address information provided to access one of memory locations in one of the SRAM and DRAM cell arrays, the second portion carrying a unique value of SRAM/DRAM address information provided to select one of the SRAM and the DRAM.

7 Claims, 14 Drawing Sheets

SEMICONDUCTOR MEMORY DEVICE HAVING AN SRAM AND A DRAM ON A SINGLE CHIP

BACKGROUND OF THE INVENTION

1. Field of the Invention

The present invention relates to a semiconductor memory device having an SRAM (static random access memory) and a DRAM (dynamic random access memory) that are provided on a single chip.

2. Description of the Related Art

For example, in conventional portable telephones, SRAMs were often employed as the memory device. Recently, however, there is a demand for portable telephones that are equipped with large-capacity memory devices, such as DRAMs, in order to promote the interfacing between the portable telephones and the Internet.

Generally, in a DRAM memory cell, a read operation must be followed by a subsequent write operation. Charge stored on the capacitor of the memory cell does not remain on the capacitor indefinitely. Due to a variety of leakage paths, the charge can eventually leak off the capacitor, causing the memory cell to loose its information. To alleviate this problem, each memory cell in the DRAM must be periodically read, sensed, and re-written to a full level. This refresh requirement distinguishes the DRAM from the SRAM.

If a portable telephone is equipped with the DRAM, instead of the SRAM, the power consumption in its standby state will be increased since the DRAM requires periodical refresh operations to retain the stored information. Although the recent demand for large-capacity memory devices is met by the DRAM-equipped portable telephone, the time that allows the portable telephone to continuously work in the standby state will be considerably reduced.

The SRAM does not require the refresh operations to retain the stored information and hardly consumes the power during its standby state. However, the density of the storage elements in the SRAM is low compared to the density of the storage elements in the DRAM. If a portable telephone is equipped with a large quantity of the SRAM devices that meets the memory capacity needed by the recent demand, the cost will be significantly increased.

SUMMARY OF THE INVENTION

In order to overcome the problems described above, preferred embodiments of the present invention provide an improved semiconductor memory device that reduces the power consumption of the entire system to a level lower than the power consumption level of the DRAM-only system and avoids the increase of the cost of the SRAM-only system while meeting the large memory capacity needed.

According to one preferred embodiment of the present invention, a semiconductor memory device includes: an SRAM which is provided on a chip, the SRAM including an SRAM cell array; a DRAM which is provided on the chip, the DRAM including a DRAM cell array; and an address signal which has a first portion and a second portion, the first portion carrying a unique value of row-column address information provided to access one of memory locations in one of the SRAM and DRAM cell arrays, the second portion carrying a unique value of SRAM/DRAM address information provided to select one of the SRAM and the DRAM.

The semiconductor memory device of the preferred embodiment includes the SRAM and the DRAM provided on a single chip. The semiconductor memory device of the present invention is effective if reducing the power consumption of the entire system to a level lower than the power consumption level of the DRAM-only system and in avoiding the increase of the cost of the SRAM-only system while meeting the large memory capacity needed.

In another preferred embodiment of the semiconductor device of the invention, a semiconductor memory device includes: an SRAM memory block which is provided on a chip, the SRAM memory block including an SRAM cell array; a DRAM memory block which is provided on the chip, the DRAM memory block including a DRAM cell array; and a source voltage which is externally supplied to the DRAM memory block when the DRAM cell array is accessed, the source voltage to the DRAM memory block being set to a ground voltage when the DRAM cell array is not accessed.

The semiconductor memory device of the above preferred embodiment of the invention is effective in reducing the power consumption when the DRAM is not used. Further, the semiconductor memory device of the present invention is effective in reducing the power consumption of the entire system to a level lower than the power consumption level of the DRAM-only system and in avoiding the increase of the cost of the SRAM-only system while meeting the large memory capacity needed.

In another preferred embodiment of the semiconductor device of the invention, a semiconductor memory device includes: an SRAM memory block which is provided on a chip, the SRAM memory block including an SRAM cell array; a DRAM memory block which is provided on the chip, the DRAM memory block including a DRAM cell array and an internal power supply circuit, the internal power supply circuit producing control voltages that arc internally supplied to the DRAM memory block; and a control unit which controls the internal power supply circuit based on control signals that are externally supplied to the control unit, wherein, when the DRAM cell array is not accessed, the control unit controls the internal power supply circuit based on the control signals so that an operation of the internal power supply circuit is stopped and the control voltages are set in a predetermined condition.

The semiconductor device of the above preferred embodiment of the invention is effective in reducing the power consumption of the entire system to a level lower than the power consumption level of the DRAM-only system and in avoiding the increase of the cost of the SRAM-only system while meeting the large memory capacity needed.

In another preferred embodiment of the semiconductor device of the invention, a semiconductor memory device includes: an SRAM memory block which is provided on a chip, the SRAM memory block including an SRAM cell array; a DRAM memory block which is provided on the chip, the DRAM memory block having a DRAM cell array; and a control unit which is connected to each of the SRAM memory block and the DRAM memory block, the control unit including a first pad and a second pad, the control unit activating an operation of one of the SRAM memory block or the DRAM memory block based on a combination of a first control value indicated by a first control signal presented to the first pad and a second control value indicated by a second control signal presented to the second pad.

The semiconductor device of the above preferred embodiment of the invention is effective in reducing the power consumption of the entire system to a level lower than the power consumption level of the DRAM-only system and in avoiding the increase of the cost of the SRAM-only system while meeting the large memory capacity needed.

In another preferred embodiment of the semiconductor device of the invention, a semiconductor memory device includes: an SRAM memory block which is provided on a chip, the SRAM memory block including an SRAM cell array having bit lines connected to column switches, the column switches connected to a data bus; a DRAM memory block which is provided on the chip, the DRAM memory block including a DRAM cell array, sense amplifiers and column gates, the DRAM cell array having bit lines connected to the column gates, the column gates connected to the data bus; and column select signals which are provided to the column gates in order to select which sense amplifier output to connect to the data bus, wherein, when accessing the SRAM cell array during a refresh operation of the DRAM cell array, all the column select signals are set to OFF state so that all the column gates are turned off by the column select signals.

The semiconductor device of the above preferred embodiment of the invention is effective in reducing the power consumption of the entire system to a level lower than the power consumption level of the DRAM-only system and in avoiding the increase of the cost of the SRAM-only system while meeting the large memory capacity needed.

BRIEF DESCRIPTION OF THE DRAWINGS

Other objects, features and advantages of the present invention will be apparent from the following detailed description when read in conjunction with the accompanying drawings in which.

DETAILED DESCRIPTION OF PREFERRED EMBODIMENTS

A description will now be provided of preferred embodiments of the present invention with reference to the accompanying drawings.

In the following preferred embodiments, semiconductor memory devices, each having an SRAM and one or more DRAMs provided therein, are constituted as a single integrated circuit chip.

Figure 1:
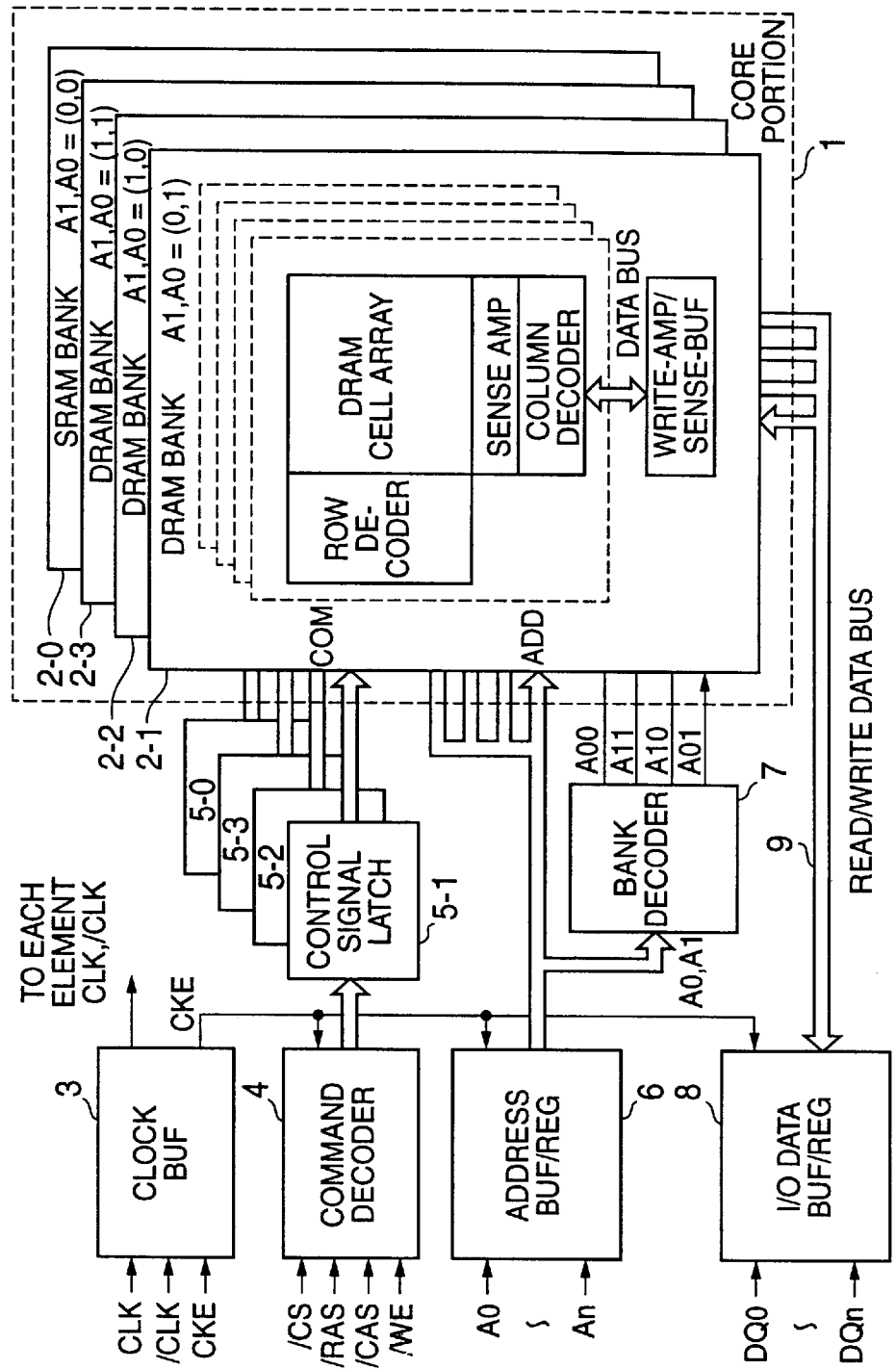
FIG. 1 is a block diagram of a first embodiment of the semiconductor memory device of the invention.

FIG. 1 shows a first embodiment of the semiconductor memory device of the invention.

As shown in FIG. 1, the semiconductor memory device of the present embodiment generally has a core portion I which is segmented into an SRAM bank 2-0, a DRAM bank 2-1, a DRAM bank 2-2 and a DRAM bank 2-3. Each memory bank of the SRAM bank 2-0 and the DRAM banks 2-1 to 2-3 can be identified by using a bank address signal presented to the memory device.

The SRAM bank 2-0 generally comprises a write-amplifier/sense-buffer (called a common SRAM buffer) and four SRAM blocks. Each block includes an SRAM cell array, a row decoder, sense amplifiers and a column decoder. The common SRAM buffer is shared by the four SRAM blocks.

Each of the DRAM banks 2-1 to 2-3 generally comprises a write-amplifier/sense-buffer (called a common DRAM buffer) and four DRAM blocks. Each block includes a DRAM cell array., a row decoder, sense amplifiers and a column decoder. The common DRAM buffer is shared by the four DRAM blocks. The elements of the DRAM bank 2-1 are shown in FIG. 1. In the semiconductor memory device of the present embodiment, the SRAM bank 2-0 and the DRAM banks 2-1 to 2-3 include substantially equivalent elements except the memory cell arrangement, and the address assignments for the respective memory banks are distinct from each other.

A description will now be provided of the elements of the DRAM bank 2-1, and a description of each of the SRAM bank 2-0 and the DRAM banks 2-2 and 2-3 will be omitted.

In the DRAM bank 2-1 of FIG. 1, the row decoder accepts as input a main portion (e.g., the first half thereof) of a data address signal ("A2 to An") presented to the memory device. From this address, the row decoder activates one of the word lines (not shown), which are provided between the row decoder and the DRAM cell array. When this word line is activated, all of the memory cells located on this line are selected and the charge from the capacitors of the memory cells will be placed on the bit lines (not shown), which are provided between the sense amplifier and the DRAM cell array. Once the signal on each of the bit lines is sensed and amplified by the sense amplifier, the column decoder uses as input the main portion (e.g., the second half thereof) of the data address signal to select which sense amplifier output to connect to the data bus. In the present embodiment, the main portion of the data address signal carries a unique value of row-column address information used to access one of the memory locations, and one of the memory locations in each memory block is accessed by using the main portion of the data address signal presented to the memory device.

In the semiconductor memory device of FIG. 1, the bank address that is presented to the core portion 1 is represented by two bits "A0" and "A1". A unique value of the two-bit SRAM/DRAM address information is assigned to identify one of the four memory banks 2-0 to 2-3 in the core portion 1. In the present embodiment, the bank address "A00" (A1, A0=[0,0]) is assigned for the SRAM bank 2-0. The bank address "A01" (A1, A0=[0,1]) is assigned for the DRAM bank 2-1. The bank address "A10" (A1, A0=[1,0]) is assigned for the DRAM bank 2-2. The bank address "A11" (A1, A0=[1,1]) is assigned for the DRAM bank 2-3.

As shown in FIG. 1, the semiconductor memory device of the present embodiment generally comprises a clock buffer 3, a command decoder 4, four control signal latches 5-0 to 5-3, an address buffer/register 6, a bank decoder 7, an input/output data buffer/register 8, and a read/write data bus 9.

The clock buffer 3 accepts and retains a clock signal CLK, a complementary clock signal /CLK, and a clock enable signal CKE, which are externally supplied to the semiconductor memory device. The clock signals CLK and /CLK are delivered to each element of the semiconductor memory device. The clock enable signal CKE is delivered to each of the command decoder 4, the address buffer/register 6 and the data buffer/register 8.

The command decoder 4 accepts one of command signals /CS (chip select), /RAS (row address strobe), /CAS (column address strobe) and /WE (read/write enable), which are externally supplied to the semiconductor memory device. Each of the command signals is decoded by the command decoder 4 into a control signal, and it is delivered to a corresponding one of the control signal latches 5-0 to 5-3 as a control signal.

Each of the control signal latches 5-0 to 5-3 latches the control signal output by the command decoder 4. The latched control signal is delivered to a corresponding one of the memory banks 2-0 to 2-3 as a command.

The address buffer/register 6 accepts and retains the data address signal "A0 to An". A main portion (A2 to An) of the data address signal is delivered to a corresponding one of the memory banks 2-0 to 2-3 as a row-column memory address. A secondary portion (A1 and A0) of the data address signal is delivered to the bank decoder 7 as the bank address signal.

The bank decoder 7 decodes the bank address signal A1, A0 output by the address buffer/register 6 into the bank address, in order to select one of the four memory banks 2-0 to 2-3.

The data buffer/register 8 accepts and retains an input/output data signal "DQ0 to DQn", which is transferred to or from the four memory banks 2-0 to 2-3.

The read/write data bus 9 is provided to transfer read/write data between the data buffer/register 8 and the memory banks 2-0 to 2-3, and is shared by the memory banks 2-0 to 2-3.

Figure 2:
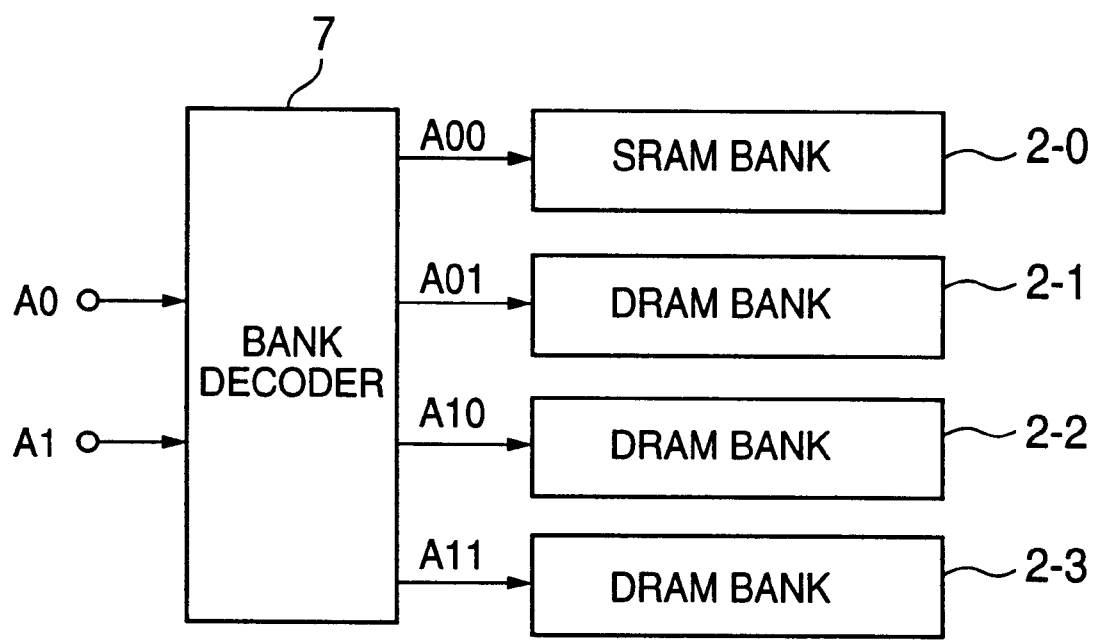
FIG. 2 is a diagram for explaining an operation of a decoder in the semiconductor memory device of FIG. 1.

FIG. 2 shows an operation of the bank decoder 19 in the semiconductor memory device of FIG. 1.

In FIG. 2, "A1" and "A0" are the bank address signal (or the secondary portion of the data address signal) that is supplied from the address buffer/register 6 to the bank decoder 7. "A00", "A01", "A10" and "A11" are the four bank addresses, one of which is asserted by the bank decoder 7 in response to the binary value of the bank address signal A1,A0 presented to the bank decoder 7. The following is a function table of the decoder 7.

| (1) FUNCTION TABLE OF DECODER 7 (FIG. 2) | | | | | |
|---|---|---|---|---|---|
| A1 | A0 | A00 | A01 | A10 | A11 |
| L | L | H | L | L | L |
| L | H | L | H | L | L |
| H | L | L | L | H | L |
| H | H | L | L | L | H |

In the TABLE (1) above, "L" denotes a low-level value (or 0) of the related signal, and "H" denotes a high-level value (or 1) of the related signal.

As indicated in FIG. 2 and the above TABLE, the decoder 7 selects the SRAM bank 2-0 among the four memory banks when the bank address "A00" is asserted (or set to the high level "H") in response to the incoming bank address signal A1,A0. The decoder 7 selects the DRAM 2-1 when the bank address "A01" is asserted in response to the bank address signal A1,A0. The decoder 7 selects the DRAM 2-2 when the bank address "A10" is asserted in response to the bank address signal A1,A0. The decoder 7 selects the DRAM 2-3 when the bank address "A11" is asserted in response to the bank address signal A1 ,A0.

Therefore, in the present embodiment, when the secondary portion of the data address signal, delivered through the address buffer/register 6 to the decoder 7, is set to "A00" (A1="L", A0="L"), the decoder 7 selects the SRAM bank 2-0. When the secondary portion of the data address signal is set to "A01" (A1="L", A0="H"), the decoder 7 selects the DRAM bank 2-1 When the secondary portion of the data address signal is set to "A10" (A1="H", A0="L"), the decoder 7 selects the DRAM bank 2-2. When the secondary portion of the data address signal is set to "A11" (A1="H", A0="H"), the decoder 7 selects the DRAM bank 2-3.

When one of the four memory banks 2-0 to 2-3 is accessed, typical signal sequences are required to operate the semiconductor memory device of the present embodiment. For example, when the control signal /RAS falls, the chip accepts the main portion (e.g., the first half thereof) of the data address signal present on the address lines as the row address. Next, when the control signal /CAS falls, the chip accepts the main portion (e.g., the second half thereof) of the data address signal present on the address lines as the column address. The control signal /WE instructs the chip that the present operation is a read or a write. At the same time, one of the memory banks 2-0 to 2-3 is selected by the decoder 7 in response to the bank address signal (A1,A0). Data is transferred in and out of the chip via the read/write data bus 9.

In the above-described embodiment, the semiconductor memory device includes the SRAM bank 2-0 and the DRAM banks 2-1 to 2-3 that are fabricated on the same chip. The semiconductor memory device of the present embodiment is effective in avoiding the increase of the cost of the SRAM-only system while meeting the large memory capacity needed, and in reducing the power consumption of the entire system to a level lower than the power consumption level of the DRAM-only system.

Figure 3:
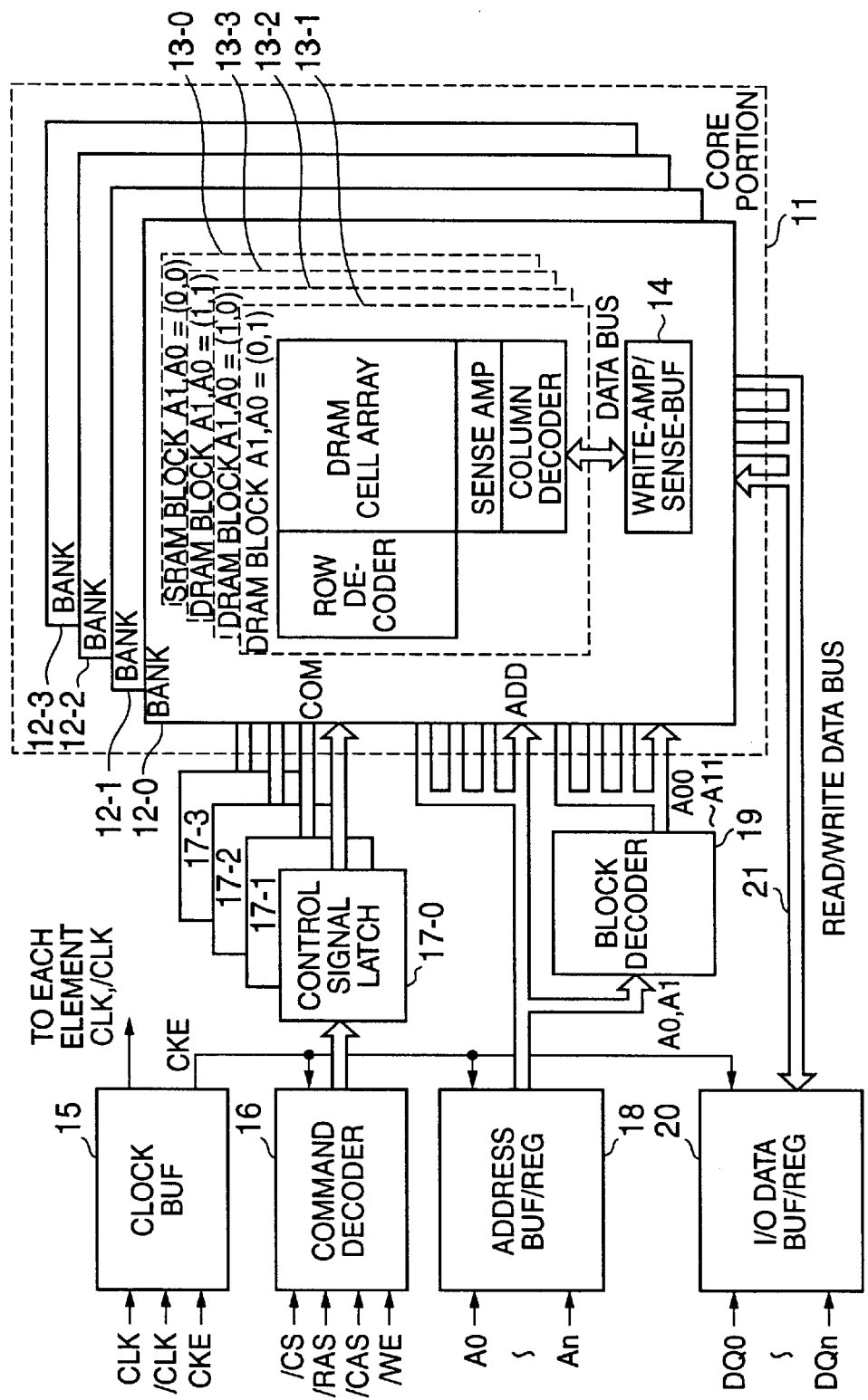
FIG. 3 is a block diagram of a second embodiment of the semiconductor memory device of the invention.

Next, FIG. 3 shows a second embodiment of the semiconductor memory device of the invention.

As shown in FIG. 3, the semiconductor memory device of the present embodiment generally has a core portion 11, which is segmented into four memory banks 12-0 to 12-3. Each of the memory banks 12-0 to 12-3 generally comprises a write-amplifier/sense-buffer (called a common buffer) 14, an SRAM block 13-0, a DRAM block 13-1, a DRAM block 13-2, and a DRAM block 13-3. The common buffer 14 is shared by the four blocks 13-0 to 13-3. Each memory block of the SRAM block 13-0 and the DRAM blocks 13-1 to 13-3 on one of the four banks 12-0 to 12-3 can be identified by using a secondary portion (called a block address signal) of the data address signal presented to the memory device. Further, a main portion of the data address signal carries a unique value of row-column address information used to access one of the memory locations, and one of the memory locations in each memory block is accessed by using the main portion of the data address signal presented to the memory device.

The SRAM block 13-0 generally comprises an SRAM cell array, a row decoder, sense amplifiers and a column decoder. The elements of the SRAM block 13-0 are not shown in FIG. 3.

Each of the DRAM blocks 13-1 to 13-3 generally comprises a DRAM cell array, a row decoder, sense amplifiers and a column decoder. The elements of the DRAM block 13-1 are shown in FIG. 3. In the semiconductor memory device of the present embodiment, the SRAM block 13-0 and the DRAM blocks 13-1 to 13-3 on one of the four memory banks 12-0 to 12-3 include substantially equivalent elements except the memory cell arrangement, and the address assignments for the respective memory blocks are distinct from each other.

In the present embodiment, the elements of each of the four blocks 13-0 to 13-3 are essentially the same as the corresponding elements in the previous embodiment of FIG. 1, and a description thereof will be omitted.

In the semiconductor memory device of FIG. 3, the block address that is presented to the core portion 11 is represented by two bits "A0" and "A1". A unique value of the two-bit SRAM/DRAM address information is assigned to identify one of the four memory blocks 13-0 to 13-3. In the present embodiment, the block address "A00" (A1, A0=[0,0]) is assigned for the SRAM block 13-0. The block address "A01" (A1, A0=[0,1]) is assigned for the DRAM block 13-1. The block address "A10" (A1, A0=[1,0]) is assigned for the DRAM block 13-2. The block address "A11" (A1, A0=[1,1]) is assigned for the DRAM block 13-3.

As shown in FIG. 3, the semiconductor memory device of the present embodiment generally comprises a clock buffer 15, a command decoder 16, four control signal latches 17-0 to 17-3, an address buffer/register 18, a block decoder 19, an input/output data buffer/register 20, and a read/write data bus 21.

The clock buffer 15 accepts and retains a clock signal CLK., a complementary clock signal /CLK, and a clock enable signal CKE, which are externally supplied to the semiconductor memory device. The clock signals CLK and /CLK are delivered to each element of the semiconductor memory device. The clock enable signal CKE is delivered to each of the command decoder 16, the address buffer/register 18 and the data buffer/register 20.

The command decoder 16 accepts one of command signals /CS, /RAS, /CAS and /WE, which are externally supplied to the semiconductor memory device. Each of the command signals is decoded by the command decoder 16 into a control signal, and it is delivered to a corresponding one of the control signal latches 17-0 to 17-3 as a control signal.

Each of the control signal latches 17-0 to 17-3 latches the control signal output by the command decoder 16. The latched control signal is delivered to a corresponding one of the memory banks 12-0 to 12-3 as a command.

The address buffer/register 18 accepts and retains the data address signal "A0 to An". A main portion (A2 to An) of the data address signal is delivered to a corresponding one of the memory banks 12-0 to 12-3 as a row-column memory address. A secondary portion (A1 and A0) of the data address signal is delivered to the block decoder 19 as the block address signal.

The block decoder 19 decodes the block address signal A1, A0 output by the address buffer/register 18 into the block address, in order to select one of the four memory blocks 13-0 to 13-3.

The data buffer/register 20 accepts and retains an input/output data signal "DQ0 to DQn", which is transferred to or from the four memory banks 12-0 to 12-3.

The read/write data bus 21 is provided to transfer read/write data between the data buffer/register 20 and the memory banks 12-0 to 12-3, and is shared by the memory banks 12-0 to 12-3.

Figure 4:
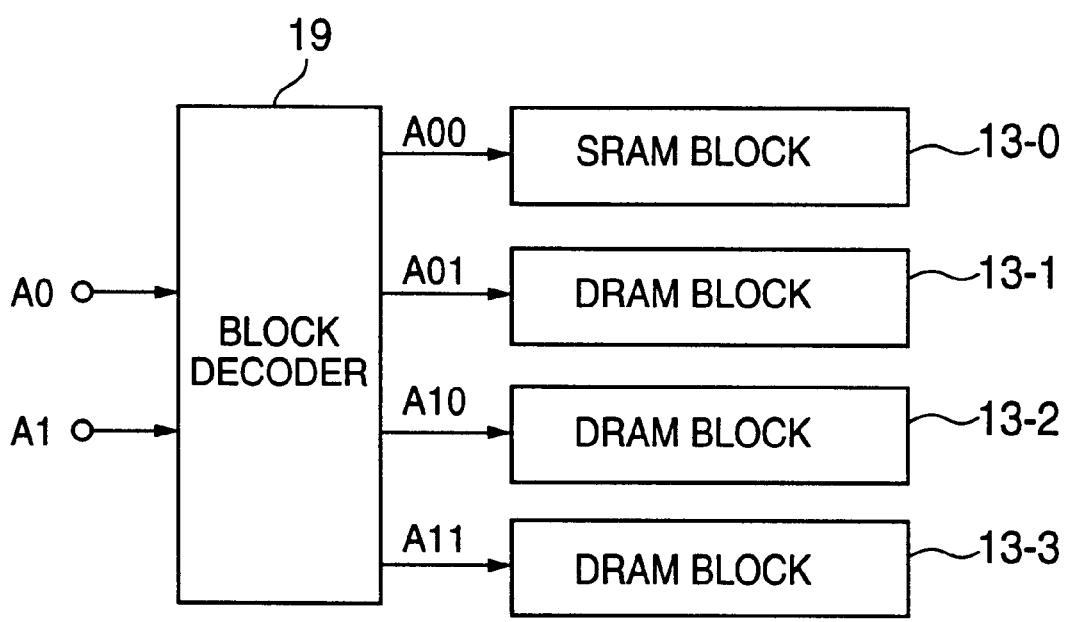
FIG. 4 is a diagram for explaining an operation of a decoder in the semiconductor memory device of FIG. 3.

FIG. 4 shows an operation of the decoder 19 in the semiconductor memory device of FIG. 3.

Similar to FIG. 2, in FIG. 4, "A1" and "A0" are the block address signal (or the secondary portion of the data address signal) that is supplied from the address buffer/register 18 to the block decoder 19. "A00", "A01", "A10" and "A11" are the four block addresses, one of which is asserted by the block decoder 19 in response to the binary value of the block address signal A1,A0 presented to the decoder 19. The following is a function table of the decoder 19.

| (2) FUNCTION TABLE OF DECODER 19 (FIG. 4) | | | | | |
|---|---|---|---|---|---|
| A1 | A0 | A00 | A01 | A10 | A11 |
| L | L | H | L | L | L |
| L | H | L | H | L | L |
| H | L | L | L | H | L |
| H | H | L | L | L | H |

As indicated in FIG. 4 and the TABLE (2) above, the decoder 19 selects the SRAM block 13-0 among the four memory blocks when the block address "A00" is asserted (or set to the high level "H") in response to the incoming block address signal A1,A0. The decoder 19 selects the DRAM block 13-1 when the bank address "A01" is asserted in response to the block address signal A1,A0. The decoder 19 selects the DRAM block 13-2 when the block address "A10" is asserted in response to the bank address signal A1,A0. The decoder 19 selects the DRAM block 13-3 when the block address "A11" is asserted in response to the bank address signal A1,A0.

Therefore, in the present embodiment, when the secondary portion of the data address signal, delivered through the address buffer/register 18 to the decoder 19, is set to "A00" (A1="L", A0="L"), the decoder 19 selects the SRAM block 13-0. When the secondary portion of the data address signal is set to "A01" (A1="L", A0="H"), the decoder 19 selects the DRAM block 13-1. When the secondary portion of the data address signal is set to "A10" (A1="H", A0="L"), the decoder 19 selects the DRAM block 13-2. When the secondary portion of the data address signal is set to "A11" (A1="H", A0="H"), the decoder 19 selects the DRAM block 13-3.

Further, in the present embodiment, the main portion of the data address signal carries a unique value of row-column address information used to access one of the memory locations, and one of the memory locations in each memory block is accessed by using the main portion of the data address signal presented to the memory device.

When one of the four memory banks 12-0 to 12-3 is accessed, typical signal sequences are required to operate the semiconductor memory device of the present embodiment. For example, when the control signal /RAS falls, the chip accepts the main portion (e.g., the first half thereof) of the data address signal present on the address lines as the row address. Next, when the control signal /CAS falls, the chip accepts the main portion (e.g., the second half thereof) of the data address signal present on the address lines as the column address. The control signal /WE instructs the chip that the present operation is a read or a write. At the same time, one of the memory banks 12-0 to 12-3 is selected by the decoder 19 in response to the bank address signal. Data is transferred in and out of the chip via the read/write data bus 21.

In the above-described embodiment, the semiconductor memory device includes the SRAM block 13-0 and the DRAM blocks 13-1 to 13-3 that are fabricated on the same chip. The semiconductor memory device of the present embodiment is effective in avoiding the increase of the cost of the SRAM-only system while meeting the large memory capacity needed, and in reducing the power consumption of the entire system to a level lower than the power consumption level of the DRAM-only system.

Figure 5:
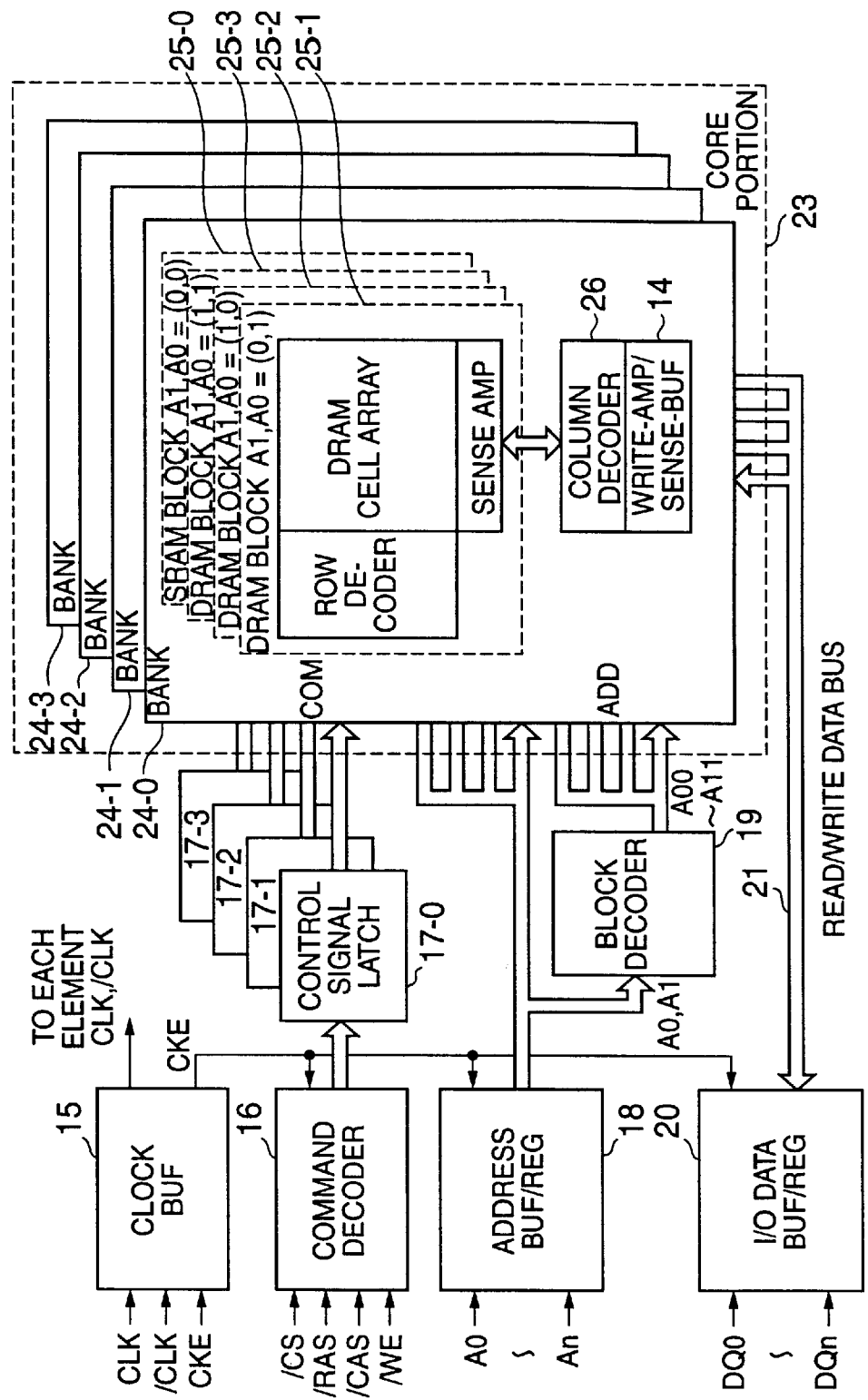
FIG. 5 is a block diagram of a third embodiment of the semiconductor memory device of the invention.

Next, FIG. 5 shows a third embodiment of the semiconductor memory device of the invention.

As shown in FIG. 5, the semiconductor memory device of the present embodiment includes a core portion 23 that has a configuration different from the configuration of the core portion 11 shown in FIG. 3. Other elements of the present embodiment are essentially the same as corresponding elements of the previous embodiment of FIG. 3, and a description thereof will be omitted.

In the semiconductor memory device of FIG. 5, the core portion 23 is segmented into four memory banks 24-0 to 24-3. Each of the memory banks 24-0 to 24-3 generally comprises a common column decoder 26, a write-amplifier/sense-buffer (called a common buffer) 14, an SRAM block 25-0, a DRAM block 25-1, a DRAM block 25-2, and a DRAM block 25-3. The common buffer 14 is shared by the four blocks 25-0 to 25-3. Also, the column decoder 26 is shared by the four blocks 25-0 to 25-3. Each memory block of the SRAM block 25-0 and the DRAM blocks 25-1 to 25-3 on one of the four banks 24-0 to 24-3 can be identified by using a secondary portion (called a block address signal) of the data address signal presented to the memory device. Further, a main portion of the data address signal carries a unique value of row-column address information used to access one of the memory locations, and one of the memory locations in each memory block is accessed by using the main portion of the data address signal presented to the memory device.

The SRAM block 25-0 generally comprises an SRAM cell array, a row decoder, and sense amplifiers. The elements of the SRAM block 25-0 are not shown in FIG. 5.

Each of the DRAM blocks 25-1 to 25-3 generally comprises a DRAM cell array, a row decoder, and sense amplifiers. The elements of the DRAM block 25-1 are shown in FIG. 5. In the semiconductor memory device of the present embodiment, the SRAM block 25-0 and the DRAM blocks 25-1 to 25-3 on one of the four memory banks 24-0 to 24-3 include substantially equivalent elements except the memory cell arrangement, and the address assignments for the respective memory blocks are distinct from each other.

In the above-described embodiment, the semiconductor memory device includes the SRAM block 25-0 and the DRAM blocks 25-1 to 25-3 that are fabricated on the same chip. The semiconductor memory device of the present embodiment is effective in avoiding the increase of the cost of the SRAM-only system while meeting the large memory capacity needed, and in reducing the power consumption of the entire system to a level lower than the power consumption level of the DRAM-only system.

Figure 6:
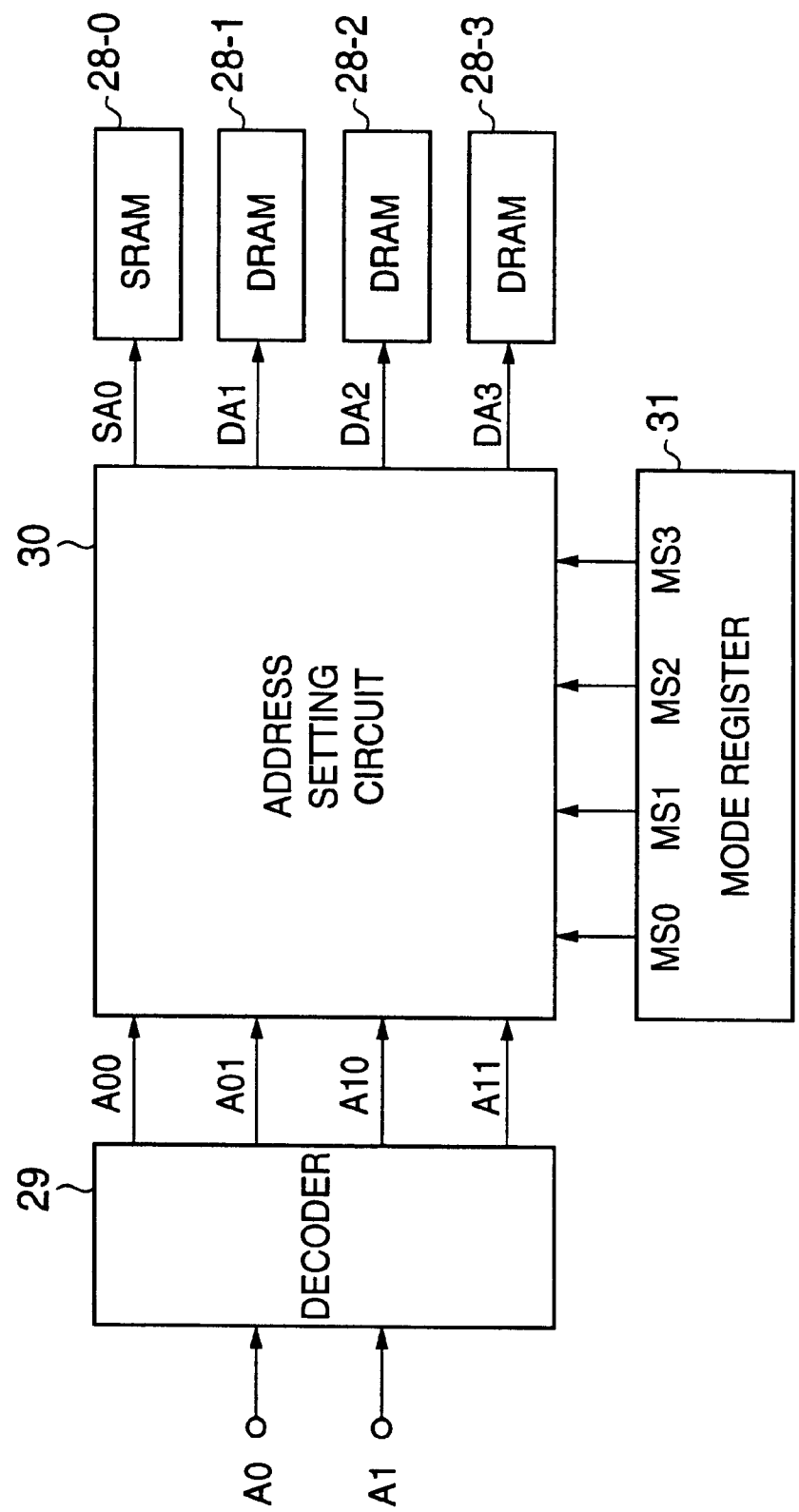
FIG. 6 is a block diagram of a fourth embodiment of the semiconductor memory device of the invention.

Next, FIG. 6 shows a fourth embodiment of the semiconductor memory device of the invention.

As shown in FIG. 6, the semiconductor memory device of the present embodiment generally includes an SRAM memory block 28-0, a DRAM memory block 28-1, a DRAM memory block 28-2, a DRAM memory block 28-3, a decoder 29, an address setting circuit 30, and a mode register 31.

The SRAM memory block 28-0 and the DRAM memory blocks 28-1 to 28-3 in the present embodiment are essentially the same as the SRAM bank 2-0 and the DRAM banks 2-1 to 2-3 of FIG. 1, the SRAM block 13-0 and the DRAM block 13-1 to 13-3 of FIG. 3, or the SRAM block 25-0 and the DRAM block 25-1 to 25-3 of FIG. 5.

Similar to the previous embodiments of FIG. 1, FIG. 3 and FIG. 5, the decoder 29 in the present embodiment receives the secondary portion (A1 and A0) of the data address signal (A0 to An) as the block address signal. The decoder 29 decodes the received block address signal (A1, A0) into a block address code (A00, A01, A10, A11), in order to select one of the four memory blocks 28-0 to 28-3. The following is a function table of the decoder 29 in the present embodiment.

| (3) FUNCTION TABLE OF DECODER 29 (FIG. 6) | | | | | |
|---|---|---|---|---|---|
| A1 | A0 | A00 | A01 | A10 | A11 |
| L | L | H | L | L | L |
| L | H | L | H | L | L |
| H | L | L | L | H | L |
| H | H | L | L | L | H |

In the semiconductor memory device of FIG. 6, the address setting circuit 30 produces memory-select signals SA0, DA1, DA2 and DA3 from the block address (or the secondary portion of the address signal) in response to mode-setting signals MS0, MS1, MS2 and MS3. The address setting circuit 30 outputs the memory-select signals SA0, DA1, DA2 and DA3 to the SRAM memory block 28-0 and the DRAM memory blocks 28-1 to 28-3 so as to access one of the four memory blocks. The memory-select signals SA0, DA1, DA2 and DA3 carry a unique value of secondary SRAM/DRAM address information that is changed from the SRAM/DRAM address information (carried by the secondary portion of the address signal) in accordance with the mode-setting signals MS0, MS1, MS2 and MS3.

The mode register 31 retains the mode-setting signals MS0, MS1, MS2 and MS3 that are supplied from an external signal source to the mode register 31, and outputs the mode-setting signals MS0, MS1, MS2 and MS3 to the address setting circuit 30 so as to control the address setting operation by the address setting circuit 30.

Figure 7:
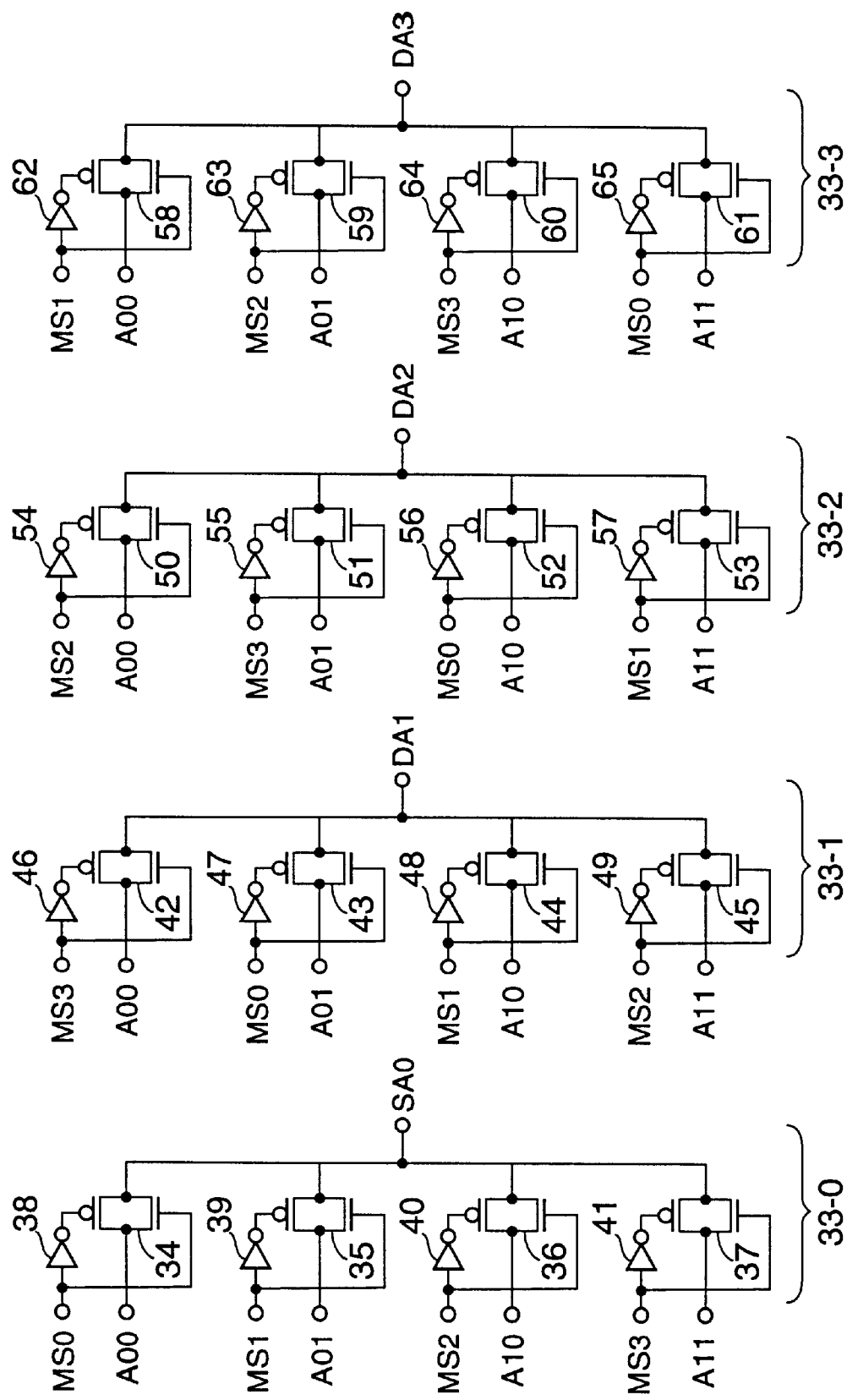
FIG. 7 is a circuit diagram for explaining a configuration of an address setting circuit in the semiconductor memory device of FIG. 6.

FIG. 7 shows a configuration of the address setting circuit 30 in the semiconductor memory device of FIG. 6.

In the address setting circuit of FIG. 7, an SA0 generating circuit 33-0, a DA1 generating circuit 33-1, a DA2 generating circuit 33-2 and a DA3 generating circuit 33-3 are provided.

The SA0 generating circuit 33-0 produces the memory-select signal SA0 that is delivered to the SRAM memory block 28-0. The SA0 generating circuit 33-0 includes four CMOS (complementary metal oxide semiconductor) gates 34, 35, 36 and 37, and four inverters 38, 39, 40 and 41. The CMOS gates 34, 35, 36 and 37 carry out logical actions on the block address codes A00, A01, A10 and A11 in response to the mode-setting signals MS0, MS1, MS2 and MS3, respectively. The inverters 38, 39, 40 and 41 invert the mode-setting signals MS0, MS1, MS2 and MS3, respectively.

The DA1 generating circuit 33-1 produces the memory-select signal DA1 that is delivered to the DRAM memory block 28-1. The DA1 generating circuit 33-1 includes four CMOS gates 42, 43, 44 and 45, and four inverters 46, 47, 48 and 49. The CMOS gates 42, 43, 44 and 45 carry out logical actions on the block address codes A00, A01, A10 and A11 in response to the mode-setting signals MS3, MS0, MS1 and MS2, respectively. The inverters 46, 47, 48 and 49 invert the mode-setting signals MS3, MS0, MS1 and MS2, respectively.

The DA2 generating circuit 33-2 produces the memory-select signal DA2 that is delivered to the DRAM memory block 28-2. The DA2 generating circuit 33-2 includes four CMOS gates 50, 51, 52 and 53, and four inverters 54, 55, 56 and 57. The CMOS gates 50, 51, 52 and 53 carry out logical actions on the block address codes A00, A01, A10 and A11 in response to the mode-setting signals MS2, MS3, MS0 and MS1, respectively. The inverters 54, 55, 56 and 57 invert the mode-setting signals MS2, MS3, MS0 and MS1, respectively.

The DA3 generating circuit 33-3 produces the memory-select signal DA3 that is delivered to the DRAM memory block 28-3. The DA3 generating circuit 33-3 includes four CMOS gates 58, 59, 60 and 61, and four inverters 62, 63, 64 and 65. The CMOS gates 58, 59, 60 and 61 carry out logical actions on the block address codes A00, A01, A10 and A11 in response to the mode-setting signals MS1, MS2, MS3 and MS0, respectively. The inverters 62, 63, 64 and 65 invert the mode-setting signals MS1, MS2, MS3 and MS0, respectively. The following is a function table of the address setting circuit 30.

(4) FUNCTION TABLE OF ADDRESS SETTING CIRCUIT 30 (FIG. 7)

| MS0 | MS1 | MS2 | MS3 | SA0 | DA1 | DA2 | DA3 |
|-----|-----|-----|-----|-----|-----|-----|-----|
| H | L | L | L | A00 | A01 | A10 | A11 |
| L | H | L | L | A01 | A10 | A11 | A00 |
| L | L | H | L | A10 | A11 | A00 | A01 |
| L | L | L | H | A11 | A00 | A01 | A10 |

Accordingly, when the address setting circuit 30 is configured as shown in FIG. 7, the relationship between the mode-setting signals MS0–MS3, the block address codes A1-A0, and the memory-select signals SA0, DA1–DA3 is as follows.

(5) RELATIONSHIP BETWEEN MS0–MS3, A1–A0, SA0, AND DA1–DA3 (FIG. 7)

| MS0 | MS1 | MS2 | MS3 | A1 | A0 | SA0 | DA1 | DA2 | DA3 |
|-----|-----|-----|-----|----|----|-----|-----|-----|-----|
|     |     |     |     |    |    | A00 | A01 | A10 | A11 |
| H | L | L | L | L | L | H | L | L | L |
| H | L | L | L | L | H | L | H | L | L |
| H | L | L | L | H | L | L | L | H | L |
| H | L | L | L | H | H | L | L | L | H |
|     |     |     |     |    |    | A01 | A10 | A11 | A00 |
| L | H | L | L | L | L | L | L | L | H |
| L | H | L | L | L | H | H | L | L | L |
| L | H | L | L | H | L | L | H | L | L |
| L | H | L | L | H | H | L | L | H | L |
|     |     |     |     |    |    | A10 | A11 | A00 | A01 |
| L | L | H | L | L | L | L | L | H | L |
| L | L | H | L | L | H | L | L | L | H |
| L | L | H | L | H | L | H | L | L | L |
| L | L | H | L | H | H | L | H | L | L |
|     |     |     |     |    |    | A11 | A00 | A01 | A10 |
| L | L | L | H | L | L | L | H | L | L |
| L | L | L | H | L | H | L | L | H. | L |
| L | L | L | H | H | L | L | L | L | H |
| L | L | L | H | H | H | H | L | L | L |

In the semiconductor memory device of the present embodiment, the address setting circuit 30 is configured as shown in FIG. 7. By supplying the appropriate mode-setting signals MS0–MS3 from the mode register 31 to the address setting circuit 30, the semiconductor memory device of the present embodiment can change the SRAM/DRAM address assignment to the four memory blocks 28-0 to 28-3 to the desired one, as indicated in the TABLE (5) above.

Specifically, for example, when the mode-setting signals MS0(H), MS1(L), MS2(L) and MS3(L,) are supplied, the SRAM/DRAM address "A00" (A1, A0=[0,0]) is assigned for the SRAM memory block 28-0, the SRAM/DRAM address "A01" (A1, A0=[0,1]) is assigned for the DRAM memory block 28-1, the SRAM/DRAM address "A10" (A1, A0=[1,0]) is assigned for the DRAM memory block 28-2, and the SRAM/DRAM address "A11" (A1, A0=[1,1]) is assigned for the DRAM memory block 28-3.

For example, when the mode-setting signals MS0(L), MS1(H), MS2(L) and MS3(L,) are supplied, the SRAM/DRAM address "A00" (A1, A0=[0,0]) is assigned for the DRAM memory block 28-3, the SRAM/DRAM address "A0" (A1, A0=[0,1]) is assigned for the SRAM memory block 28-0, the SRAM/DRAM address "A10" (A1, A0=[1,0]) is assigned for the DRAM memory block 28-1, and the SRAM/DRAM address "A11" (A1, A0=[1,1]) is assigned for the DRAM memory block 28-2.

For example, when the mode-setting signals MS0(L), MS1(L), MS2(H) and MS3(L) are supplied, the SRAM/DRAM address "A00" (A1, A0=[0,0]) is assigned for the DRAM memory block 28-2, the SRAM/DRAM address "A01" (A1, A0=[0,1]) is assigned for the DRAM memory block 28-3, the SRAM/DRAM address "A10" (A1, A0=[1,0]) is assigned for the SRAM memory block 28-0, and the SRAM/DRAM address "A11" (A1, A0=[1,1]) is assigned for the DRAM memory block 28-1.

For example, when the mode-setting signals MS0(L), MS1(L), MS2(L) and MS3(H) are supplied, the SRAM/DRAM address "A00" (A1, A0=[0,0]) is assigned for the DRAM memory block 28-1, the SRAM/DRAM address "A01" (A1, A0=[0,1]) is assigned for the DRAM memory block 28-2, the SRAM/DRAM address "A10" (A1, A0=[1,0]) is assigned for the DRAM memory block 28-3, and the SRAM/DRAM address "A11" (A1, A0=[1,1]) is assigned for the SRAM memory block 28-0.

Figure 8:
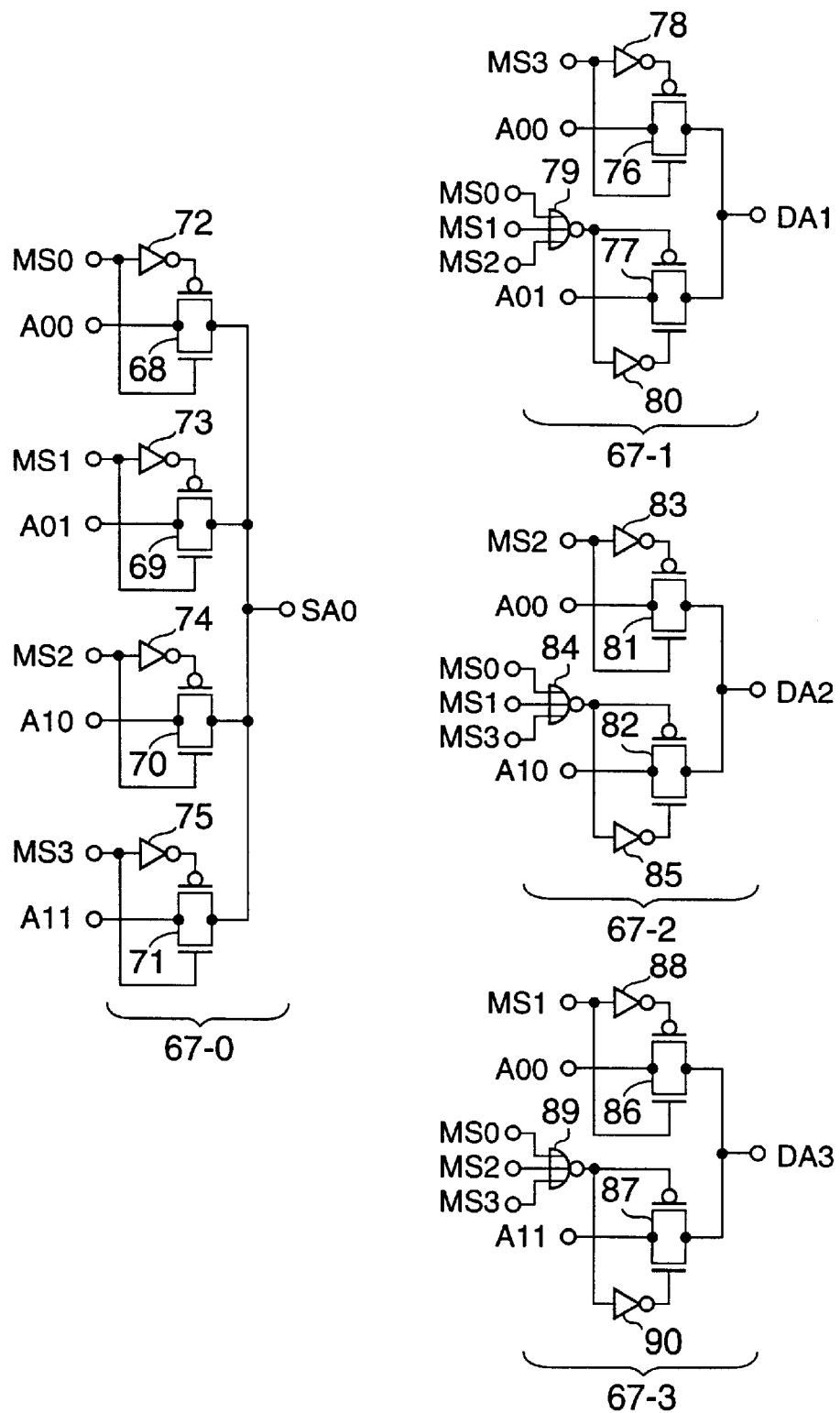
FIG. 8 is a circuit diagram for explaining another configuration of the address setting circuit in the semiconductor memory device of FIG. 6.

Next, FIG. 8 shows another configuration of the address setting circuit 30 in the semiconductor memory device of FIG. 6.

In the address setting circuit of FIG. 8, an SA0 generation circuit 67-0, a DA1 generating circuit 67-1, a DA2 generating circuit 67-2 and a DA3 generating circuit 67-3 are provided.

The SA0 generating circuit 67-0 produces the memory-select signal SA0 that is delivered to the SRAM memory block 28-0. The SA0 generating circuit 67-0 includes four CMOS gates 68, 69, 70 and 71, and four inverters 72, 73, 74 and 75. The CMOS gates 68, 69, 70 and 71 carry out logical actions on the block address codes A00, A01, A10 and A11 in response to the mode-setting signals MS0, MS1, MS2 and MS3, respectively. The inverters 72, 73, 74 and 75 invert the mode-setting signals MS0, MS1, MS2 and MS3, respectively.

The DA1 generating circuit 67-1 produces the memory-select signal DA1 that is delivered to the DRAM memory block 28-1. The DA1 generating circuit 67-1 includes two CMOS gates 76 and 77, two inverters 78 and 80, and an NOR gate 79. The CMOS gate 76 carries out a logical action on the block address code A00 in response to the mode-setting signal MS3. The CMOS gate 77 carries out a logical action on the block address code A01 in response to the mode-setting signals MS0, MS1 and MS2. The inverter 78 inverts the mode-setting signal MS3. The NOR gate 79 carries out an NOR action on the mode-setting signals MS0, MS1 and MS2. The inverter 80 inverts an output signal of the NOR gate 79.

The DA2 generating circuit 67-2 produces the memory-select signal DA2 that is delivered to the DRAM memory block 28-2. The DA2 generating circuit 67-2 includes two CMOS gates 81 and 82, two inverters 83 and 85, and an NOR gate 84. The CMOS gate 81 carries out a logical action on the block address code A00 in response to the mode-setting signal MS2. The CMOS gate 82 carries out a logical action on the block address code A 10 in response to the mode-setting. signals MS0, MS1 and MS3. The inverter 83 inverts the mode-setting signal MS2. The NOR gate 84 carries out an NOR action on the mode-setting signals MS0, MS1 and MS3. The inverter 85 inverts an output signal of the NOR gate 84.

The DA3 generating circuit 67-3 produces the memory-select signal DA3 that is delivered to the DRAM memory block 28-3. The DA3 generating circuit 67-3 includes two CMOS gates 86 and 87, two inverters 88 and 90, and an NOR gate 89. The CMOS gate 86 carries out a logical action on the block address code A00 in response to the mode-setting signal MS3. The CMOS gate 87 carries out a logical action on the block address code A11 in response to the mode-setting signals MS0, MS2 and MS1. The inverter 88 inverts the mode-setting signal MS3. The NOR gate 89 carries out an NOR action on the mode-setting signals MS0, MS2 and MS1. The inverter 90 inverts an output signal of the NOR gate 89. The following is a function table of the address setting circuit 30.

(6) FUNCTION TABLE OF ADDRESS SETTING CIRCUIT 30 (FIG. 8)

| MS0 | MS1 | MS2 | MS3 | SA0 | DA1 | DA2 | DA3 |
|-----|-----|-----|-----|-----|-----|-----|-----|
| H | L | L | L | A00 | A01 | A10 | A11 |
| L | H | L | L | A01 | A00 | A10 | A11 |
| L | L | H | L | A10 | A01 | A00 | A10 |
| L | L | L | H | A11 | A01 | A10 | A00 |

Accordingly, when the address setting circuit 30 is configured as shown in FIG. 8, the relationship between the mode-setting signals MS0–MS3, the block address codes A1–A0, and the memory-select signals SA0, DA1–DA3 is as in the following table.

(7) RELATIONSHIP BETWEEN MS0–MS3, A1–A0, SA0, AND DA1–DA3 (FIG. 8)

| MS0 | MS1 | MS2 | MS3 | A1 | A0 | SA0 | DA1 | DA2 | DA3 |
|-----|-----|-----|-----|----|----|-----|-----|-----|-----|
| H | L | L | L |   |   | A00 | A01 | A10 | A11 |
| H | L | L | L | L | L | H | L | L | L |
| H | L | L | L | L | H | L | H | L | L |
| H | L | L | L | H | L | L | L | H | L |
| H | L | L | L | H | H | L | L | L | H |
| L | H | L | L |   |   | A01 | A00 | A10 | A11 |
| L | H | L | L | L | L | L | H | L | L |
| L | H | L | L | L | H | H | L | L | L |
| L | H | L | L | H | L | L | L | H | L |
| L | H | L | L | H | H | L | L | L | H |
| L | L | H | L |   |   | A10 | A01 | A00 | A11 |
| L | L | H | L | L | L | L | L | H | L |
| L | L | H | L | L | H | L | H | L | L |
| L | L | H | L | H | L | H | L | L | L |
| L | L | H | L | H | H | L | L | L | H |
| L | L | L | H |   |   | A11 | A01 | A10 | A00 |
| L | L | L | H | L | L | L | L | L | H |
| L | L | L | H | L | H | L | H | L | L |
| L | L | L | H | H | L | L | L | H | L |
| L | L | L | H | H | H | H | L | L | L |

In the semiconductor memory device of the present embodiment, the address setting circuit 30 is configured as shown in FIG. 8. By supplying the appropriate mode-setting signals MS0–MS3 from the mode register 31 to the address setting circuit 30, the semiconductor memory device of the present embodiment can change the SRAM/DRAM address assignment to the four memory blocks 28-0 to 28-3 to the desired one, as indicated in the TABLE (7) above.

Specifically, for example, when the mode-setting signals MS0(H), MS1(L), MS2(L) and MS3(L) are supplied, the SRAM/DRAM address "A00" (A1, A0=[0,0]) is assigned for the SRAM memory block 28-0, the SRAM/DRAM address "A01" (A1, A0=[0,1]) is assigned for the DRAM memory block 28-1, the SRAM/DRAM address "A10" (A1, A0=[1,0]) is assigned for the DRAM memory block 28-2, and the SRAM/DRAM address "A11" (A1, A0=[1,1]) is assigned for the DRAM memory block 28-3.

For example, when the mode-setting signals MS0(L), MS1(H), MS2(L) and MS3(L) are supplied, the SRAM/DRAM address "A00" (A1, A0=[0,0]) is assigned for the DRAM memory block 28-1, the SRAM/DRAM address "A01" (A1, A0=[0,1]) is assigned for the SRAM memory block 28-0, the SRAM/DRAM address "A10" (A1, A0=[1,0]) is assigned for the DRAM memory block 28-2, and the SRAM/DRAM address "A11" (A1, A0=[1,1]) is assigned for the DRAM memory block 28-3.

For example, when the mode-setting signals MS0(L), MS1(L), MS2(H) and MS3(L) are supplied, the SRAM/

DRAM address "A00" (A1, A0=[0,0]) is assigned for the DRAM memory block 28-2, the SRAM/DRAM address "A01" (A1, A0=[0,1]) is assigned for the DRAM memory block 28-1, the SRAM/DRAM address "A10" (A1, A0=[1,0]) is assigned for the SRAM memory block 28-0, and the SRAM/DRAM address "A11" (A1, A0=[1,1]) is assigned for the DRAM memory block 28-3.

For example, when the mode-setting signals MS0(L), MS1(L), MS2(L) and MS3(H) are supplied, the SRAM/DRAM address "A00" (A1, A0=[0,0]) is assigned for the DRAM memory block 28-3, the SRAM/DRAM address "A01" (A1, A0=[0,1]) is assigned for the DRAM memory block 28-1, the SRAM/DRAM address "A10" (A1, A0=[1,0]) is assigned for the DRAM memory block 28-2, and the SRAM/DRAM address "A11" (A1, A0=[1,1]) is assigned for the SRAM memory block 28-0.

Figure 9:
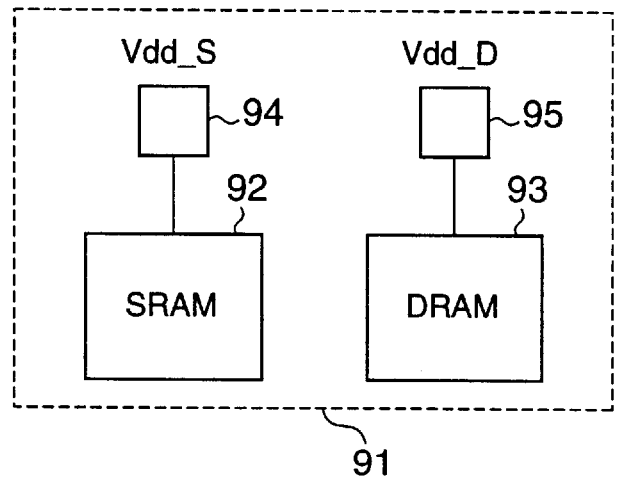
FIG. 9 is a block diagram of a fifth embodiment of the semiconductor memory device of the invention.

Next, FIG. 9 shows a fifth embodiment of the semiconductor memory device of the invention.

As shown in FIG. 9, the semiconductor memory device of the present embodiment is constituted as an integrated circuit chip 91. The semiconductor memory device of the present embodiment generally comprises an SRAM memory block 92 and a DRAM memory block 93. The SRAM memory block 92 includes an SRAM cell array. The DRAM memory block 93 includes a DRAM cell array. The SRAM memory block 92 and the DRAM memory block 93 are fabricated on the chip 91.

In the semiconductor memory device of FIG. 9, the SRAM memory block 92 includes an SRAM power pad 94, and this power pad 94 accepts as input a source voltage Vdd_S that is supplied by an external source to the SRAM memory block 92. The DRAM memory block 93 includes a DRAM power pad 95, and this power pad 95 accepts as input a source voltage Vdd_D that is supplied by an external source to the DRAM memory block 93.

In the present embodiment, the power pad 94 and the power pad 95 are separately provided for supplying power to the SRAM memory block 92 and the DRAM memory block 93.

Figure 10:
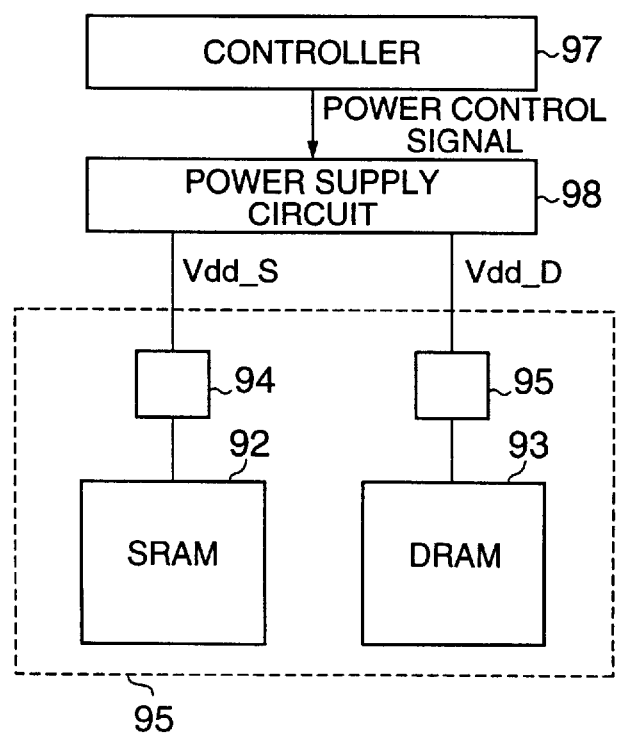
FIG. 10 is a diagram showing an essential portion of a control system in which the semiconductor memory device of FIG. 9 is provided.

FIG. 10 shows an essential portion of a control system in which the semiconductor memory device of FIG. 9 is provided.

As shown in FIG. 10, the control system generally comprises a semiconductor memory device 96 (which is the semiconductor memory device of FIG. 9), a controller 97, and a power supply circuit 98. The power supply circuit 98 is controlled by a power control signal output by the controller 97. Under the control of the controller 97, the power supply circuit 98 supplies the source voltage Vdd_S to the power pad 94 and supplies the source voltage Vdd_D to the power pad 95. The source voltage Vdd_S is supplied to the SRAM memory block 92 via the power pad 94. The source voltage Vdd_D is supplied to the DRAM memory block 93 via the power pad 95.

In the control system of FIG. 10, the power supply circuit 98 is controlled by the controller 97 such that the power supply circuit 98 supplies a ground voltage (=0 V), instead of the source voltage Vdd_D, to the DRAM memory block 93 when the DRAM cell array is not accessed, and, only when the DRAM cell array is accessed, the power supply circuit 98 supplies the source voltage Vdd_D to the DRAM memory block 93. In the present embodiment, when the DRAM is not accessed, the source power, supplied by the power supply circuit 98 to the DRAM memory block 93, is cut off by the power control signal output by the controller 97. It is possible to remarkably reduce the power consumption of the semiconductor memory device 96 when the DRAM is not accessed.

Figure 11:
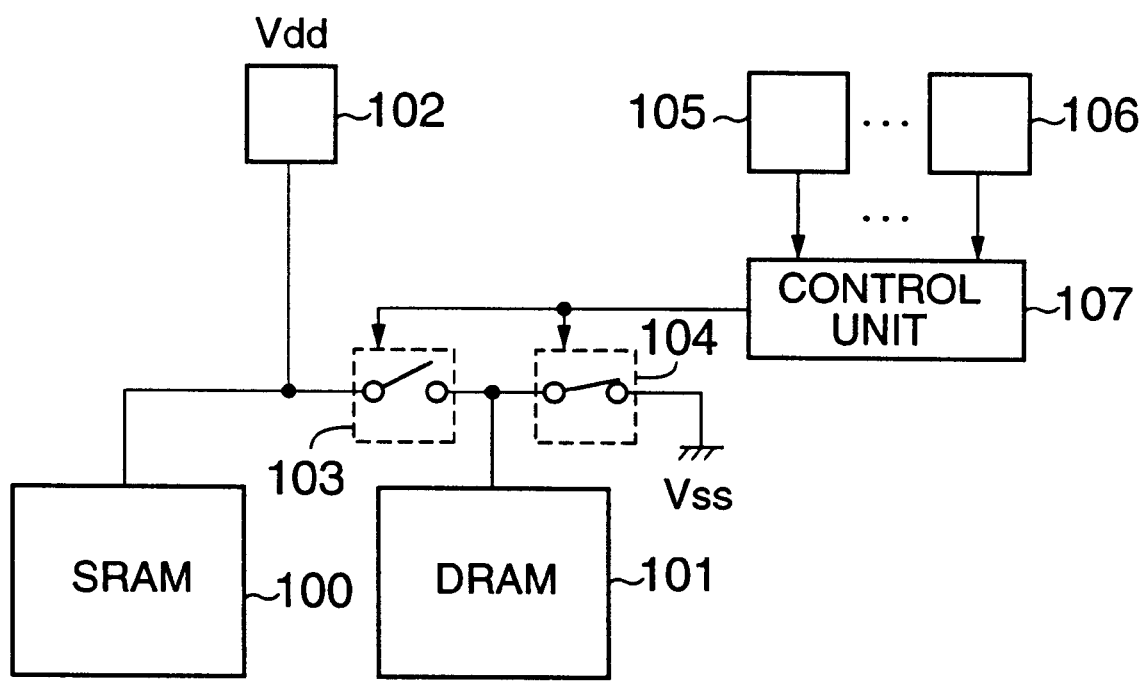
FIG. 11 is a block diagram of a sixth embodiment of the semiconductor memory device of the invention.

Next, FIG. 11 shows a sixth embodiment of the semiconductor memory device of the invention.

As shown in FIG. 11, the semiconductor memory device of the present embodiment generally comprises an SRAM memory block 100, a DRAM memory block 101, a power pad 102, a first switch 103, a second switch 104, a control signal pad 105, a control signal pad 106, and a control unit 107. The SRAM memory block 100 includes an SRAM cell array. The DRAM memory block 101 includes a DRAM cell array. The SRAM memory block 100 and the DRAM memory block 101 are fabricated on a single chip.

In the semiconductor memory device of FIG. 11, the power pad 102 is connected directly to the SRAM memory block 100, and connected to the DRAM memory block 101 via the first switch 103. The second switch 104 has a first end connected to the DRAM memory block 101 and a second end connected to a grounded terminal to which a ground voltage VSS (=0 V) is applied.

In the semiconductor memory device of FIG. 11, the power pad 102 is shared by the SRAM memory block 100 and the DRAM memory block 101. The power pad 102 accepts as input a source voltage Vdd that is supplied by an external power source to the memory device. The control signal pads 105 and 106 accept as input control signals that are supplied by an external signal source to the control unit 107. The control unit 107 controls ON/OFF of the first and second switches 103 and 104 based on a combination of control values indicated by the control signals received at the control signal pads 105 and 106.

In the semiconductor memory device of FIG. 11, when the DRAM cell array is accessed, the control unit 107 controls the first and second switches 103 and 104 based on the control signals so that the first switch 103 is turned on and the second switch 104 is turned off. In this case, the source voltage Vdd is supplied from the power pad 102 to the DRAM memory block 101. When the DRAM cell array is not accessed, the control unit 107 controls the first and second switches 103 and 104 based on the control signals so that the first switch 103 is turned off and the second switch 104 is turned on. In this case, the source power Vdd, supplied from the power pad 102 to the DRAM memory block 101, is cut off by the first switch 103 which is turned off.

In the present embodiment, a DRAM activate control signal may be used as one of the control signals presented to the control signal pads 105 and 106. It is possible for the semiconductor memory device of the present embodiment to remarkably reduce the power consumption when the DRAM is not used.

Figure 12:
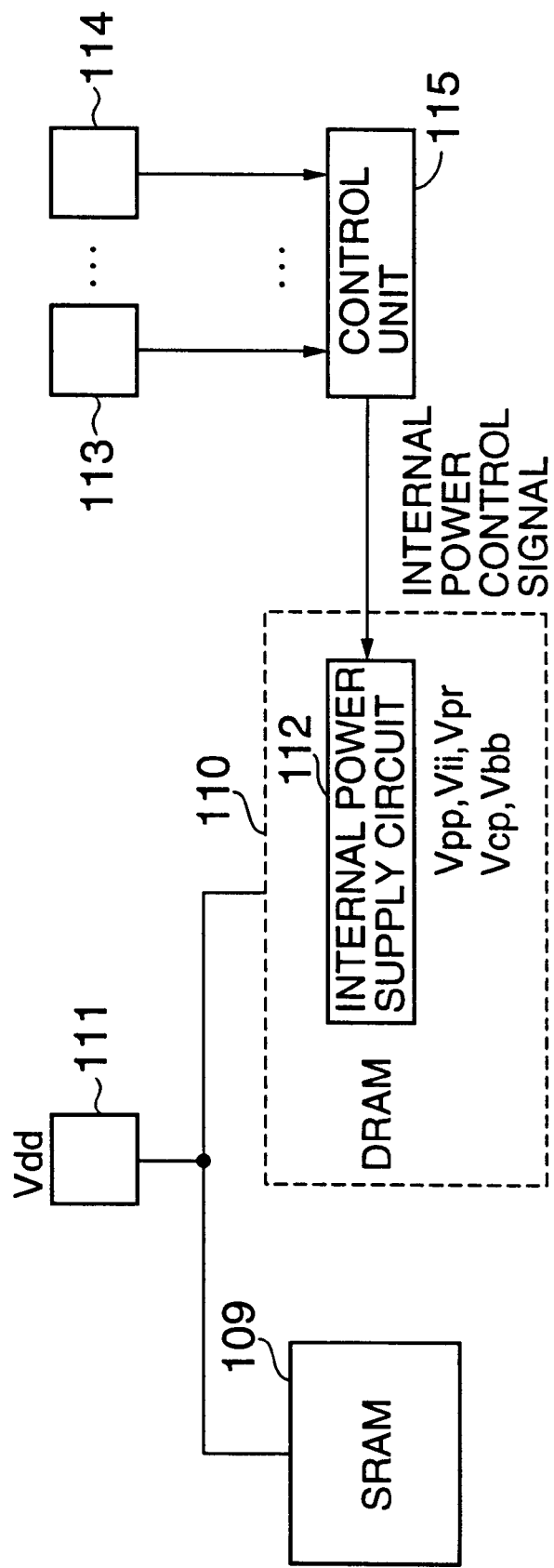
FIG. 12 is a block diagram of a seventh embodiment of the semiconductor memory device of the invention.

Next, FIG. 12 shows a seventh embodiment of the semiconductor memory device of the invention.

As shown in FIG. 12, the semiconductor memory device of the present embodiment generally comprises an SRAM memory block 109, a DRAM memory block 110, a power pad 111, a control signal pad 113, a control signal pad 114, and a control unit 115. The SRAM memory block 109 includes an SRAM cell array. The DRAM memory block 110 includes a DRAM cell array. The SRAM memory block 109 and the DRAM memory block 110 are fabricated on a single chip.

In the semiconductor memory device of FIG. 12, the DRAM memory block 110 further includes an internal power supply circuit 112. The internal power supply circuit 112 produces a power-increase voltage Vpp, a power-decrease voltage Vii, a precharge voltage Vpr, a cell plate voltage Vcp, and a base biasing voltage Vbb, which are internally supplied to the DRAM memory block 110.

The power pad 111 is shared by the SRAM memory block 109 and the DRAM memory block 110. The power pad 111 accepts as input a source voltage Vdd that is supplied by an external power source to the memory device. The control signal pads 113 and 114 accept as input control signals that are supplied by an external signal source to the control unit 115. The control unit 115 controls the internal power supply circuit 112 by supplying an internal power control signal based on a combination of control values indicated by the control signals received at the control signal pads 113 and 114.

In the semiconductor memory device of FIG. 12, when the DRAM cell array is accessed, the control unit 115 controls the internal power supply circuit 112 based on the control signals so that the internal power supply circuit 112 normally produces the power-increase voltage Vpp, the power-decrease voltage Vii, the precharge voltage Vpr, the cell plate voltage Vcp and the base biasing voltage Vbb. In this case, the internal power supply circuit 112 internally supplies these control voltages to the DRAM memory block 110. When the DRAM cell array is not accessed, the control unit 115 controls the internal power supply circuit 112 based on the control signals so that the operation of the internal power supply circuit 112 is stopped and the control voltages are set to Vpp=Vii=Vdd, Vpr=Vcp=Vbb=Vss.

In the present embodiment, a DRAM activate control signal may be used as one of the control signals presented to the control signal pads 113 and 114. For example when the DRAM activate control signal is set at a high level that indicates the DRAM cell array is being accessed, the control unit 115 allows the internal power supply circuit 110 to produce the control voltages. On the other hand, when the DRAM activate control signal is set at a low level that indicates the DRAM cell array is not being accessed, the control unit 115 stops the operation of the internal power supply circuit 112 and sets the control voltages in the predetermined condition.

The semiconductor memory device of the present embodiment is effective in avoiding the increase of the cost of the SRAM-only system while meeting the large memory capacity needed, and in reducing the power consumption of the entire system to a level lower than the power consumption level of the DRAM-only system. Further, it is possible for the semiconductor memory device of the present embodiment to remarkably reduce the power consumption when the DRAM is not used.

Figure 13:
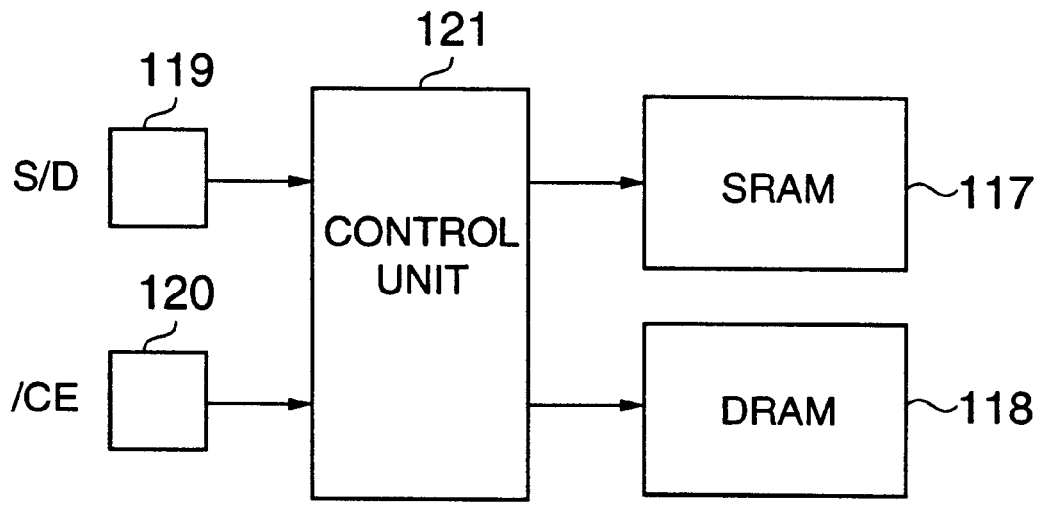
FIG. 13 is a block diagram of an eighth embodiment of the semiconductor memory device of the invention.

Next, FIG. 13 shows an eighth embodiment of the semiconductor memory device of the invention.

As shown in FIG. 13, the semiconductor memory device of the present embodiment generally comprises an SRAM memory block 117 and a DRAM memory block 118. The SRAM memory block 117 includes an SRAM cell array. The DRAM memory block 118 includes a DRAM cell array. The SRAM memory block 117 and the DRAM memory block 118 are fabricated on a single chip.

Further, the semiconductor memory device of the present embodiment generally comprises a control unit 121, which is connected to each of the SRAM memory block 117 and the DRAM memory block 118. The control unit 121 includes a first pad 119 and a second pad 120. In the present embodiment, an SRAM/DRAM state control signal S/D is presented to the first pad 119, and a chip enable signal /CE is presented to the second pad 120. The control unit 121 activates an operation of one of the SRAM memory block 117 or the DRAM memory block 118 30 based on a combination of a first control value indicated by the control signal S/D presented to the first pad 119 and a second control value indicated by the chip enable signal /CE presented to the second pad 120. The following is a function table of the control unit 121.

| (8) FUNCTION TABLE OF CONTROL UNIT 121 (FIG. 13) | | |
|---|---|---|
| S/D | /CE | |
| X | H | SRAM 117 = STANDBY, DRAM 118 = STANDBY |
| L | L | SRAM 117 = ACTIVE DRAM 118 = STANDBY |
| H | L | SRAM 117 = STANDBY DRAM 118 = ACTIVE |

In the TABLE (8) above, "L" denotes a low-level value (or 0) of the related signal, "H" denotes a highi-level value (or 1) of the related signal, and "X" denotes a "don't care" value.

As indicated in the TABLE (8), when the chip enable signal /CE is set at a high level (H), the control unit 121 places both the SRAM memory block 117 and the DRAM memory block 118 in a standby mode. When the chip enable signal /CE is set at a low level (L) and the control signal S/D is set at a low level (L), the control unit 121 activates only the operation of the SRAM memory block 117. When the chip enable signal /CE is set at a low level (L) and the control signal S/D is set at a high level (H), the control unit 121 activates only the operation of the DRAM memory block 118. Therefore, it is possible for the semiconductor memory device of the present embodiment that the same memory address is assigned for the SRAM cell array and the DRAM cell array.

The semiconductor memory device of the present embodiment is effective in avoiding the increase of the cost of the SRAM-only system while meeting the large memory capacity needed, and in reducing the power consumption of the entire system to a level lower than the power consumption level of the DRAM-only system.

Figure 14:
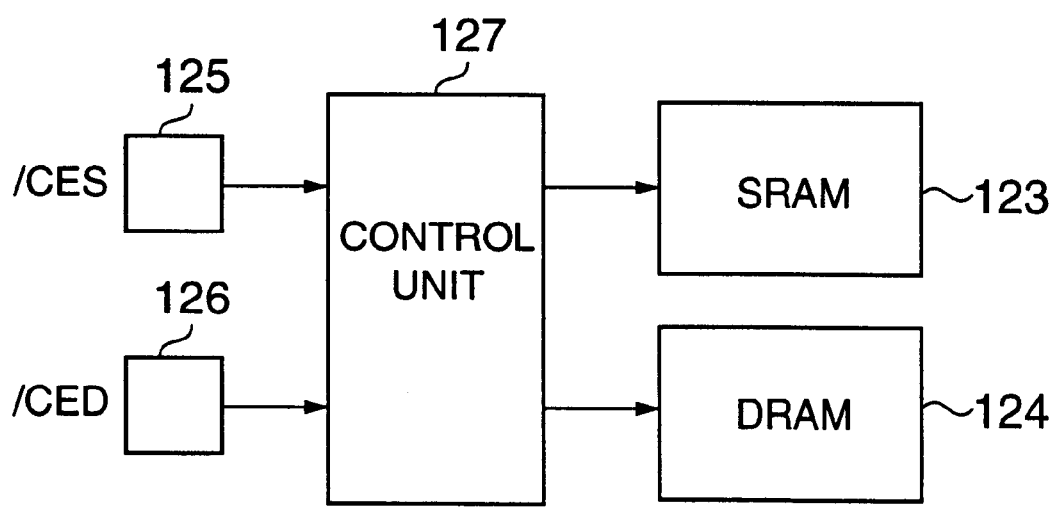
FIG. 14 is a block diagram of a ninth embodiment of the semiconductor memory device of the invention.

Next, FIG. 14 shows a ninth embodiment of the semiconductor memory device of the invention.

As shown in FIG. 14, the semiconductor memory device of the present embodiment generally comprises an SRAM memory block 123 and a DRAM memory block 124. The SRAM memory block 123 includes an SRAM cell array. The DRAM memory block 124 includes a DRAM cell array. The SRAM memory block 123 and the DRAM memory block 124 are fabricated on a single chip.

Further, the semiconductor memory device of the present embodiment generally comprises a control unit 127, which is connected to each of the SRAM memory block 123 and the DRAM memory block 124. The control unit 127 includes a first pad 125 and a second pad 126. In the present embodiment, an SRAM enable signal /CES is presented to the first pad 125, and a DRAM enable signal /CED is presented to the second pad 126. The control unit 127 activates an operation of one of the SRAM memory block 123 or the DRAM memory block 124 based on a combination of a first control value indicated by the control signal /CES presented to the first pad 125 and a second control value indicated by the control signal /CED presented to the second pad 126. The following is a function table of the control unit 127.

(9) FUNCTION TABLE OF CONTROL UNIT 127 (FIG. 14)

| /CES | /CED |  |
|------|------|---|
| H | H | SRAM 123 = STANDBY |
|   |   | DRAM 124 = STANDBY |
| L | H | SRAM 123 = ACTIVE |
|   |   | DRAM 124 = STANDBY |
| H | L | SRAM 123 = STANDBY |
|   |   | DRAM 124 = ACTIVE |

As indicated in the TABLE (9), when the SRAM enable signal /CES is set at a high level (H) and the DRAM enable signal /CED is set at a high level (H), the control unit 127 places both the SRAM memory block 123 and the DRAM memory block 124 in a standby mode. When the SRAM enable signal /CES is set at a low level (L) and the DRAM enable signal /CED is set at the high level (H), the control unit 127 activates only the operation of the SRAM memory block 123. When the SRAM enable signal /CES is set at the high level (H) and the DRAM enable signal /CED is set at the low level (L), the control unit 127 activates only the operation of the DRAM memory block 124. Therefore, it is possible for the semiconductor memory device of the present embodiment that the same memory address is assigned for the SRAM cell array and the DRAM cell array.

The semiconductor memory device of the present embodiment is effective in avoiding the increase of the cost of the SRAM-only system while meeting the large memory capacity needed, and in reducing the power consumption of the entire system to a level lower than the power consumption level of the DRAM-only system.

Figure 15:
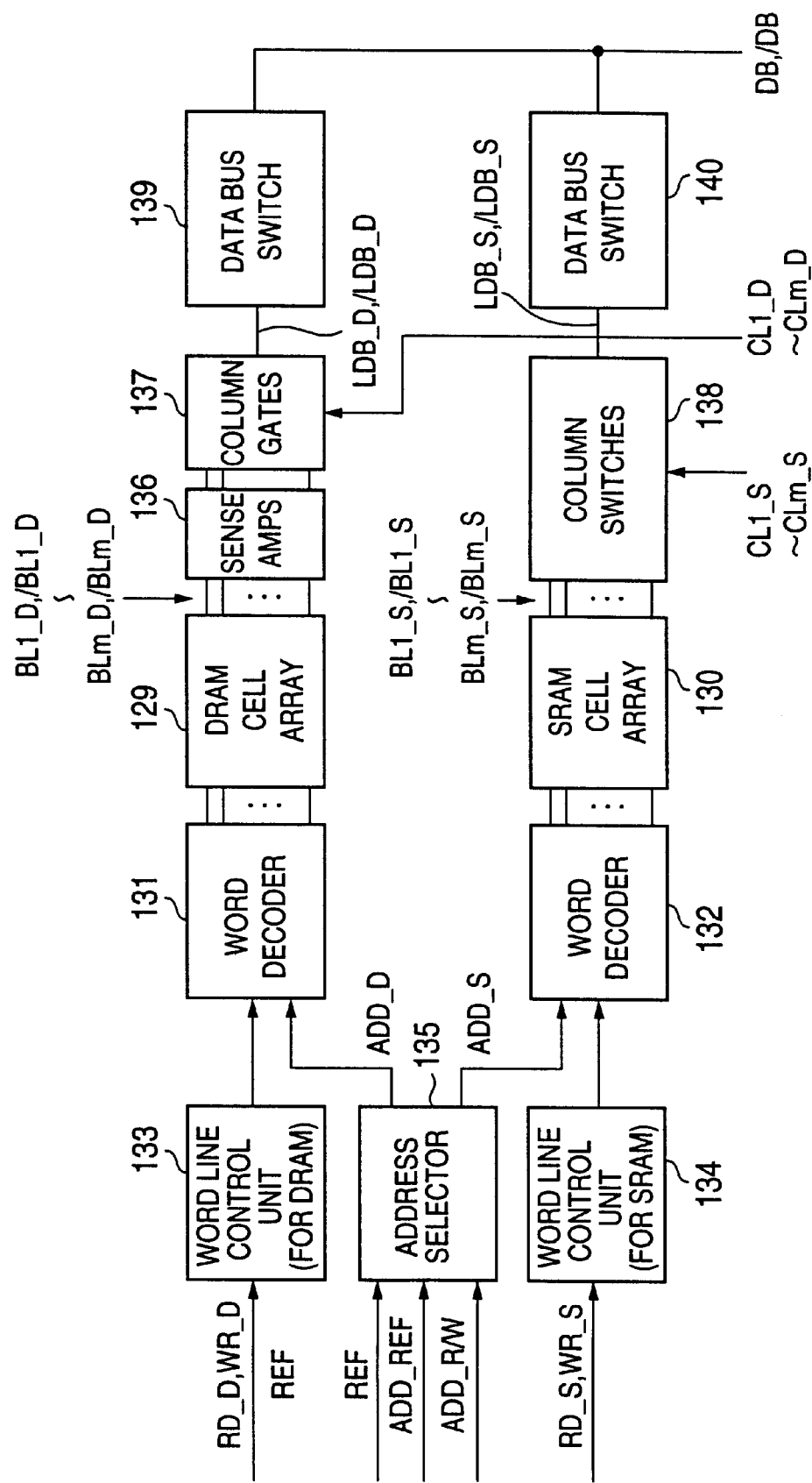
FIG. 15 is a block diagram of a tenth embodiment of the semiconductor memory device of the invention.

Next, FIG. 15 shows a tenth embodiment of the semiconductor memory device of the invention.

As shown in FIG. 15, the semiconductor memory device of the present embodiment generally comprises a DRAM cell array 129, an SRAM cell array 130, a word decoder 131, and a word decoder 132. The word decoder 131 serves to identify the appropriate word line from among the word lines between the word decoder 131 and the DRAM cell array 129. The word decoder 132 serves to identify the appropriate word line from among the word lines between the word decoder 132 and the SRAM cell array 130.

The semiconductor memory device of FIG. 15 generally comprises a word line control unit 133 for the DRAM cell array 129, a word line control unit 134 for the SRAM cell array 130, and an address selector 135. The word line control unit 133 receives a DRAM read control signal RD_D, a DRAM write control signal WR_D, and a DRAM refresh control signal REF. The word line control unit 133 controls the time to activate the appropriate word line of the DRAM cell array 129 based on the received control signal.

The word line control unit 134 receives an SRAM read control signal RD_S and an SRAM write control signal WR_S. The word line control unit 134 controls the time to activate the appropriate word line of the SRAM cell array 130 based on the received control signal.

The address selector 135 receives a refresh control signal REF, a read/write address signal ADD_R/W, and a refresh address signal ADD_REF. When the DRAM cell array 129 is not performing the refresh operation, the address selector 135 delivers the read/write address signal ADD_R/W to the word decoder 131 as a DRAM address signal ADD_D, and delivers the read/write address signal ADD_R/W to the word decoder 132 as an SRAM address signal ADD_S.

When the DRAM cell array 129 is performing the refresh operation, the address selector 135 delivers the refresh address signal ADD_REF to the word decoder 131 as the DRAM address signal ADD_D. When the read/write address signal ADD_R/W is received during the refresh operation of the DRAM cell array 129, the address selector 135 delivers the read/write address signal ADD_R/W to the word decoder 132 as the SRAM address signal ADD_S.

Further, the semiconductor memory device of FIG. 15 generally comprises a row of sense amplifiers 136, a row of column gates 137, a row of column switches 138, a data bus switch 139, and a data bus switch 140. In the semiconductor memory device of FIG. 15, the word decoder 131, the DRAM cell array 129, the sense amplifiers 136 and the column gates 137 form a DRAM memory block, while the word decoder 132, the SRAM cell array 130 and the column switches 138 form an SRAM memory block. The DRAM memory block and the SRAAM memory block are fabricated on a single chip.

In FIG. 15, "BL1_D", "/BL1_D", ..., "BLm_D" and "/BLm_D" denote the bit lines between the DRAM cell array 129 and the sense amplifier rows 136. "BL1_S", "/BL1_S", ..., "BLm_S" and "/BLm_S" denote the bit lines between the SRAM cell array 130 and the column switch rows 138. "DB" and "/DB" denote the data bus. "LDB_D" and "/LDB_D" denote a local data bus provided for the DRAM cell array 129, and this local data bus connects the column gates 137 and the data bus switch 139. "LDB_S" and "/LDB_S" denote a local data bus provided for the SRAM cell array 130, and this local data bus connects the column switches 138 and the data bus switch 140.

The sense amplifiers 136 are connected to the bit lines from the DRAM cell array 129. The column gates 137 are connected through the sense amplifiers 136 to the bit lines from the DRAM cell array 129. Column select signals CL1_D to CLm_D, one of which is asserted, are delivered to the column gates 137. The column gates 137 are turned on or off in accordance with the column select signals CL1_D to CLm_D in order to select which sense amplifier to connect to the data bus.

The column switches 138 are connected to the bit lines from the SRAM cell array 130. Column select signal CL1_S to CLm_S, one of which is asserted, are delivered to the column switches 138. The column switches 138 are turned on or off in accordance with the column select signals CL1_S to CLm_S in order to identify the appropriate column among the columns of the SRAM cell array 130.

In the present embodiment, when accessing the SRAM cell array 130 during the refresh operation of the DRAM cell array 129, all the column select signals CL1_D to CLm_D are set to OFF state, and all the column gates 137 are turned off by such column select signals. When accessing the SRAM cell array 130 during the refresh operation of the DRAM cell array 129, the word line of the DRAM cell array 129 and the word line of the SRAM cell array 130 are activated at the same time. However, all the column gates 137 are turned off by the column select signals CL1_D to CLm_D. This makes it possible to avoid the collision on the data bus DB,/DB between the data related to the DRAM cell array 129 and the data related to the SRAM cell array 130.

The semiconductor memory device of the present embodiment provides efficient accessing operations of the memory device because the SRAM cell array can be accessed even when the DRAM cell array is performing the refresh operation. Further, the DRAM cell array and the SRAM cell array are provided on a single chip, and the semiconductor memory device of the present embodiment is effective in avoiding the increase of the cost of the SRAM-only system while meeting the large memory capacity needed, and in reducing the power consumption of the entire system to a level lower than the power consumption level of the DRAM-only system.

Figure 16:
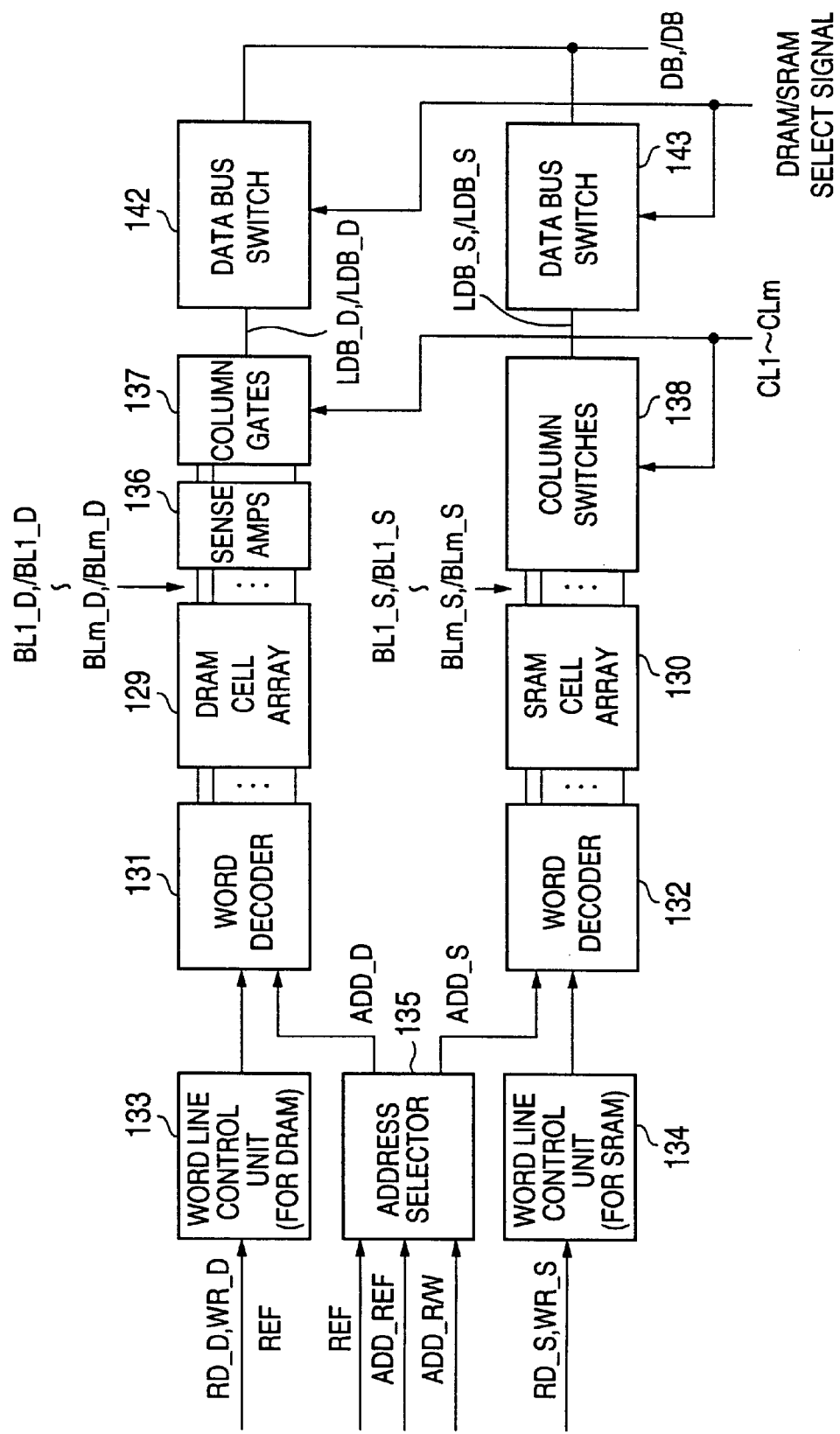
FIG. 16 is a block diagram of an eleventh embodiment of the semiconductor memory device of the invention.

Next, FIG. 16 shows an eleventh embodiment of the semiconductor memory device of the invention.

As shown in FIG. 16, the semiconductor memory device of the present embodiment differs from the previous embodiment of FIG. 15 only in that the column gates 137 and the column switches 138 are turned on or off in accordance with common column select signals CL1 to CLm, and that data bus switches 142 and 143 having a configuration different from the configuration of the data bus switches 139 and 140 are provided. Other elements in the present embodiment are essentially the same as corresponding elements in FIG. 15, and a description thereof will be omitted.

In the semiconductor memory device of FIG. 16, both the data bus switches 142 and 143 receive a DRAM/SRAM select signal, and the data bus switches 142 and 143 are turned on or off in accordance with the DRAM/SRAM select signal. When accessing the SRAM cell array 130 during the refresh operation of the DRAM cell array 129, the DRAM/SRAM select signal is set to a controlled value and delivered to the data bus switches 142 and 143, so that the data bus switch 142 related to the DRAM cell array 129 is turned off and the data bus switch 143 related to the SRAM cell array 130 is turned on in accordance with the DRAM/SRAM select signal.

In the present embodiment, when accessing the SRAM cell array 130 during the refresh operation of the DRAM cell array 129, the word line of the DRAM cell array 129 and the word line of the SRAM cell array 130 are activated at the same time. However, the data bus switch 142 is turned off and the data bus switch 143 is turned on by the DRAM/SRAM select signal. This makes it possible to avoid the collision on the data bus DB, /DB between the data related to the DRAM cell array 129 and the data related to the SRAM cell array 130.

The semiconductor memory device of the present embodiment provides efficient accessing operations of the memory device because the SRAM cell array can be accessed even when the DRAM cell array is performing the refresh operation. Further, the DRAM cell array and the SRAM cell array are provided on a single chip, and the semiconductor memory device of the present embodiment is effective in avoiding the increase of the cost of the SRAM-only system while meeting the large memory capacity needed, and in reducing the power consumption of the entire system to a level lower than the power consumption level of the DRAM-only system.

The present invention is not limited to the above-described preferred embodiments, and variations and modifications may be made without departing from the scope of the present invention.

Further, the present invention is based on Japanese priority application No. 11-150792, filed on May 31, 1999, the entire contents of which are hereby incorporated by reference.

What is claimed is:

1. A semiconductor memory device comprising:

an SRAM provided on a chip, the SRAM including an SRAM cell array;

a DRAM provided on the chip, the DRAM including a DRAM cell array; and an address input circuit receiving an address signal, the address signal having a first portion and a second portion, the first portion carrying a unique value of row-column address information provided to access one of memory locations in one of the SRAM and DRAM cell arrays, the second portion carrying a unique value of SRAM/DRAM address information provided to select one of the SRAM and the DRAM.

2. The semiconductor memory device of claim 1, wherein the semiconductor memory device is configured with an SRAM bank and one or a plurality of DRAM banks, said SRAM constitutes a unit of the SRAM bank, and said DRAM constitutes a unit of each DRAM bank.

3. The semiconductor memory device of claim 1, wherein the semiconductor memory device is configured with a plurality of memory banks, and each memory bank contains both said SRAM and said DRAM as units of the memory bank.

4. The semiconductor memory device of claim 3, wherein said SRAM and said DRAM in one of the plurality of memory banks shares a column identifying circuit.

5. The semiconductor memory device of claim 4, wherein said shared circuit is a column decoder connected to each of the SRAM and DRAM cell arrays via sense amplifiers thereof.

6. The semiconductor memory device of claim 1, further comprising an address setting circuit for producing memory-select signals from the second portion of the address signal in response to mode-setting signals, the address setting circuit outputting the memory-select signals to the SRAM and the DRAM so as to access one of the SRAM and the DRAM, the memory-select signals carrying a unique value of secondary SRAM/DRAM address information that is changed from the SRAM/DRAM address information carried by the second portion of the address signal.

7. The semiconductor memory device of claim 1, further comprising a decoder, provided on the chip, for receiving the second portion of the address signal and for selecting one of the SRAM and the DRAM in response to the unique value of the SRAM/DRAM address information.

* * * * *